(12) United States Patent
Ohnakado

(10) Patent No.: US 6,844,596 B2
(45) Date of Patent: Jan. 18, 2005

(54) SI-MOS HIGH-FREQUENCY SEMICONDUCTOR DEVICE

(75) Inventor: Takahiro Ohnakado, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/911,581

(22) Filed: Jul. 25, 2001

(65) Prior Publication Data

US 2002/0033504 A1 Mar. 21, 2002

(30) Foreign Application Priority Data

Sep. 21, 2000 (JP) ........................................ 2000-287419

(51) Int. Cl.$^7$ ............................................. H01L 23/62
(52) U.S. Cl. ...................... 257/355; 257/173; 257/356; 257/379; 257/546
(58) Field of Search ................................ 257/173, 355, 257/356, 357, 379, 546, 601

(56) References Cited

U.S. PATENT DOCUMENTS

| | | | | |
|---|---|---|---|---|
| 5,939,753 A | * | 8/1999 | Ma et al. ..................... | 257/339 |
| 5,973,897 A | * | 10/1999 | Opris et al. .................. | 361/56 |
| 6,002,569 A | * | 12/1999 | Horvath ....................... | 361/111 |
| 6,060,752 A | * | 5/2000 | Williams ..................... | 257/355 |
| 6,180,996 B1 | | 1/2001 | Onoda et al. | |
| 6,278,312 B1 | * | 8/2001 | Dabral et al. ............... | 327/310 |
| 6,351,363 B1 | * | 2/2002 | Wang .......................... | 361/111 |
| 2002/0086467 A1 | * | 7/2002 | Chang et al. ............... | 438/155 |

FOREIGN PATENT DOCUMENTS

JP          11-224939          8/1999

OTHER PUBLICATIONS

Dutoit et al., "Lateral Polysilicon p–n Diodes", Journal of Electrochemcial Society, vol. 125, No. 10, 1978, pp. 1648–1651.

Miyawaki et al., "A 20–mm$^2$, 1.8–V–Only, 16–Mb DINOR Flash Memory With Gate–Protected–Poly–Diode (GPPD) Charge Pump", IEEE Journal of Solid-State Circuits, vol. 34, 1999, pp. 1551–1556.

Ker et al., "Novel Octagonal Device Structure For Output Transistors In Deep–Submicron Low–Voltage CMOS Technology", IEDM, 1996, pp. 889–892.

* cited by examiner

Primary Examiner—Tom Thomas
Assistant Examiner—N. Drew Richards
(74) Attorney, Agent, or Firm—Leydig, Voit & Mayer, Ltd.

(57) ABSTRACT

A sophisticated and highly reliable high-frequency Si-MOS semiconductor device having high electrostatic discharge (ESD) resistance. Lateral polysilicon diodes are connected between high-frequency I/O signal lines and the external supply voltage, VDD, and between the ground, GND, and the high-frequency I/O signal lines, respectively. The forward direction of the diodes is the direction from the high-frequency I/O signal line to the supply voltage, VDD, and the direction from the ground, GND, to the high-frequency I/O signal line, respectively.

8 Claims, 35 Drawing Sheets

SI-MOS HIGH-FREQUENCY SEMICONDUCTOR DEVICE

BACKGROUND OF THE INVENTION

The present invention relates to a high-frequency semiconductor device employing an Si-MOS transistor, and especially relates to achievement of a reliable and sophisticated high-frequency semiconductor device having high ESD (Electro Static Discharge) resistance.

SUMMARY OF THE INVENTION

Mobile phone and wireless LAN have become widespread in application in recent years, so high-frequency semiconductor devices, which are necessary in electric devices for these uses to improve their performance, have size and cost concerns. To produce a high-frequency semiconductor device, a III–V compound semiconductor, such as GaAs, with high electron mobility is mainly used. However, with the miniaturization of Si-MOS transistors rapidly in recent years, it has become possible to form MOS (Metal-Oxide-Semiconductor) transistors having a gate length 0.2 μm or less, whereby the transconductance, Gm, of an MOS transistor is greatly improved so that high-frequency characteristics are improved and the transistors become applicable to high-frequency devices in the GHz band. The invention achieves a reliable and sophisticated high-frequency semiconductor device having high ESD (Electro Static Discharge) resistance employing an MOS transistor of Si.

A phenomenon in which an electrostatically charged object contacts other object(s) and causes an electrical discharge is called ESD (Electro Static Discharge). When this phenomenon happens to a semiconductor device, it may destroy semiconductor elements of the semiconductor device. As theoretical models of ESD, of the HBM (Human Body Model) represents a discharge from an electrically charged human body to semiconductor elements, MM (Machine Model) represents a discharge from an electrically charged machine to a semiconductor element, and CDM (Charge Device Model) represents a discharge from a charged semiconductor device itself to a grounded object. The current waveforms of HBM and CDM are shown in FIG. 1. In the figure, a current of approximately 1 A flows for a relatively long time (up to 100 ns) in the HBM and a large current of approximately 10 A flows for a very short time (up to 1 ns) in the CDM.

As mentioned above, in the case of ESD, impressing large current into the semiconductor element in a short time results in melt-down of the element due to heating (this is referred as thermal destruction). Moreover, in case a high voltage caused by ESD is applied to a gate insulating layer of an MOS transistor, which is typically and widely used in recent Si-LSI (Large-Scaled Integration) devices, breakdown of the gate insulating layer may be caused. Accordingly, these kinds of device destruction caused by ESD, i.e. thermal destruction and breakdown of insulation, are problematic.

In order to prevent such destruction, various protection circuits are typically included in a semiconductor device between internal circuits on a Si wafer and I/O pins so a high voltage surge due to EDS is not transmitted to the internal circuit. Since the I/O pins are connected to I/O pads on the wafer through wire bonding, protection circuits are typically located between the internal circuit and the I/O pads. Anyway, these protection circuits are commonly used and called as ESD protection circuits.

As ESD protection circuits, circuit wherein MOS transistors in OFF state are connected to I/O signal line is often used as referred in the article by M-D. Ker et.al., "IEDM, pp.889–892, 1996" (hereinafter article 1) for example. FIG. 2 is a circuit diagram illustrating typical ESD protection circuit. As shown in the figure, drain of N-type MOS transistor (hereinafter referred as NMOS) 31 wherein gate, source and P-well thereof are grounded and drain of P-type MOS transistor (hereinafter referred as PMOS) 32 wherein gate, source and N-well thereof are connected to external supply voltage (hereinafter referred as VDD) are connected to the I/O signal line connecting the I/O pad 30 and the internal circuit 100. Since MOS transistor 31 and 32 are both in OFF state, no current can flow through these transistors and give no effect on operation of the semiconductor device ordinarily. When a surge due to ESD is impressed from the I/O pad 30, parasitic bipolar transistor action shall be occurred in either of these transistors to form path for flowing, i.e. dispersing, large current from the drain to the source thereof.

With referring to FIG. 3, the parasitic bipolar transistor action of the MOS transistor will be described. It is assumed that surge 45 of positive voltage enters into the drain of NMOS 31 in here. First of all, a positive voltage of the surge is impressed to N+ diffusion layer 313 of drain. When the positive voltage of surge is increased, PN junction of N+ diffusion layer 313, which is reversely biased with this surge, causes breakdown and impact ionization occurs to generate a large amount of pair of electron and hole. Among generated pairs of electron and hole, the electron flow into the drain of positive voltage and the hole shall flow into grounded P-well 314. With presenting current owing to the flowing holes as $I_{hole}$, and resistance of the P-well as $R_{sub}$, the voltage difference of $I_{hole} \cdot R_{sub}$ shall appear in the depth direction within the P-well 314, thereby electric potential of P-well region 350 directly below a gate 311 of NMOS increases positively. At this time, in NPN parasitic bipolar transistor comprising the N+ diffusion layer 313 of drain, P-well region 350 directly below the gate and the N+ diffusion layer 312 of source, junction between the N+ diffusion layer 313 of drain and P-well region 350 is reversely biased and junction between the P-well region 350 and the N+ diffusion layer 312 of source is forwardly biased, thereby turning ON the NPN parasitic bipolar transistor. As described above, although the NMOS 31 is ordinarily in OFF state because the gate 311 is grounded, the positive is voltage of ESD surge 45 turns ON the NPN parasitic bipolar so that large current can be flown as shown with arrow 333. In addition, the positive voltage of surge is also applied to the drain of PMOS 32 and biases diode junction between the drain and N-well forwardly, thereby the diode junction is turned ON to disperse a current to the N-well.

Similarly, when ESD of negative voltage is impressed to the I/O pad 30, parasitic bipolar of PMOS 32 is turned ON to disperse a large current to the VDD. The negative voltage of surge is also applied to the drain of the NMOS 31 and turns ON a diode junction between the drain and P-well to disperse a current into the P-well.

Thus, with using the ESD protection circuit employing MOS transistor in OFF state can disperse a large current to the GND and the VDD so as to prevent thermal destruction and breakdown of the gate insulating layer with preventing that large current enters into internal circuit.

In order to accomplish the good ESD protection by the MOS transistors in OFF state, it is well known that layout of the MOS transistors should be noted. That is, in the MOS transistors for ESD protection, sufficient distance between gate electrode 60 and contact 63 connected to source or drain diffusion layer is required, i.e. certain distance 65 between gate and contact must be maintained as shown in FIG. 4. According to the article 1 by M-D. Ker et.al., the required distance 65 between gate and contact is 5 to 6 µm. With assuming the distance 65 between gate and contact to be "d", the diameter of the contact 63 to be "c", the width of source region 61 and drain region 62 situated between the gate electrodes 60 is obtained by an equation of "2d+c". Since it is required to take the distance 65 between gate and contact enough in MOS transistor used as ESD protection element, the width of the source region 61 and the drain region 62 shall become larger. For example, in the design rule of 0.2 µm, typical diameter "c" of the contact 63 is approximately 0.2 µm, therefore, the width of the source region 61 and the drain region 62 obtained by "2d+c" is very large such as 10.2 to 12.2 µm. Moreover, in order to achieve sufficient ESD protection, the width, which appears in up and down direction in FIG. 4, of the gate of the MOS transistor should be at least 100 µm or more. In the design rule of 0.2 µm, parasitic capacitances of source/drain diffusion layer, i.e. depletion layer capacity of PN junction between source/drain diffusion layer and well, is commonly 1 fF/µm$^2$. Therefore, in the MOS transistor used as ESD protection element, parasitic capacitances of the source/drain diffusion layers for Si substrates, that is wells, is very large, such as 1.02 to 1.22 pF.

This large parasitic capacitances of ESD protection element had not been a problem in a semiconductor memory and a semiconductor logic device, however, it causes serious problem in the high-frequency semiconductor device using Si-MOSes. That is, since an impedance |z| due to capacitance C is presented by 1/(2 πfC), the larger a frequency "f" becomes, i.e at high frequency, the smaller the impedance |z| becomes. When the capacity "C" further increases, impedance |z| of the capacity "C" is to be further reduced. That is, in a case where large capacitance of the drain diffusion layer is connected to high-frequency I/O signal line, the impedance due to this drain diffusion layer capacitance becomes very small.

As shown in the article of R. Groves "IEEE BCTM pp.149–152, 1999" (hereinafter article 2), high quality semiconductivie substrates having high resistivity such as substrates used for semiconductor device of GaAs compound are hardly available in Si semiconductor device. Accordingly, substrates of relatively low resistance are employed in Si semiconductor device. Therefore, in case of connecting ESD protection elements to the high-frequency I/O signal line as equivalent circuit in FIG. 5, the capacitance of drain diffusion layers in ESD protection element 33 and 34 are large so that the impedance at high frequency is very small. Moreover, due to that resistances 35 and 36 of Si substrate to which the capacitance 33 and 34 are connected are also small, most of high frequency signal Si on the high-frequency I/O signal line flow into the ESD protection element and are dispersed into the resistance of Si substrate.

As mentioned above, it has not been possible in the prior art to achieve a sophisticated and highly reliable high-frequency Si-MOS semiconductor device having high ESD resistance through forming ESD protection element.

The present invention provide a sophisticated and highly reliable high-frequency Si-MOS semiconductor device having high ESD resistance.

A high-frequency semiconductor device according to one embodiment of the present invention is characterized in that lateral polysilicon diodes are connected between high-frequency I/O signal line and external power supply VDD, and between ground GND and the high-frequency I/O signal line respectively, and forward direction of the lateral polysilicon diode is direction from the high-frequency I/O signal line to the external supply voltage VDD, and from the ground GND to the high-frequency I/O signal line respectively.

A high-frequency semiconductor device according to another embodiment of the present invention is characterized in that lateral polysilicon diodes to the number of "m" are connected between the high-frequency I/O signal line and externally supplied voltage VDD in series, and lateral polysilicon diodes to the number of "n" are connected between the ground GND and the high-frequency I/O signal line in series, and forward direction of lateral polysilicon diode is direction from the high-frequency I/O signal line to the external supply voltage VDD and from the GND to the high-frequency I/O signal line, and with assuming the voltage of VDD as $V_{dd}$, $V_{dd}/(n+m)$ is preferably smaller than 1.1[V].

A high-frequency semiconductor device according to still other embodiment of the present invention is characterized in that at least a MOS transistor, a dielectric film of capacitor and a lateral polysilicon diode are provided on its substrate, and wherein the lateral polysilicon diodes are formed from the same polysilicon layer as a lower electrode of the capacitor, and wherein a gate electrode of MOS transistor is formed from another polysilicon layer. The gate electrode of the MOS transistor may be formed from the same polysilicon layer as the upper electrode of the capacitor.

A high-frequency semiconductor device according to still further embodiment of the present invention is characterized in that dielectric film of the capacitor or/and polysilicon layer used for upper electrode of the capacitor are left on and covering a PN junction of lateral polysilicon diodes, and edges of resist pattern used for injecting ion into the lateral polysilicon diodes are placed on the dielectric film or/and polysilicon layer on the PN junction.

A high-frequency semiconductor device according to further still other embodiment of the present invention is characterized in that a clamp circuit connected between the externally supplied voltage VDD and ground GND, wherein the clamp circuit operates to flow current within voltage lower than the absolute value of reverse-breakdown voltage of the lateral polysilicon diodes.

DETAILED DESCRIPTION

EMBODIMENT 1

Figure 1:
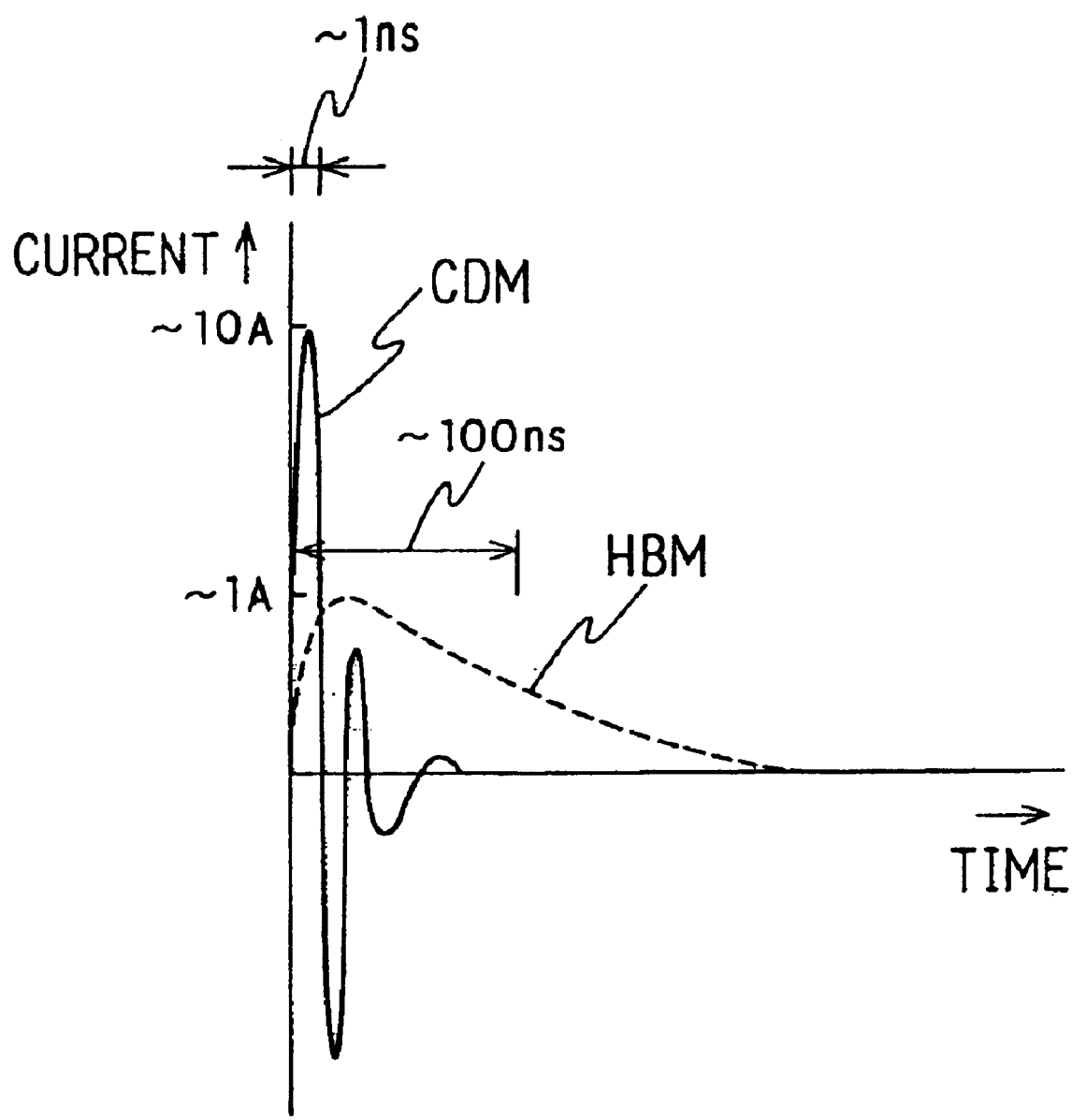
FIG. 1 is a figure showing a current wave form of ESD (Electro Static Discharge)
Figure 2:
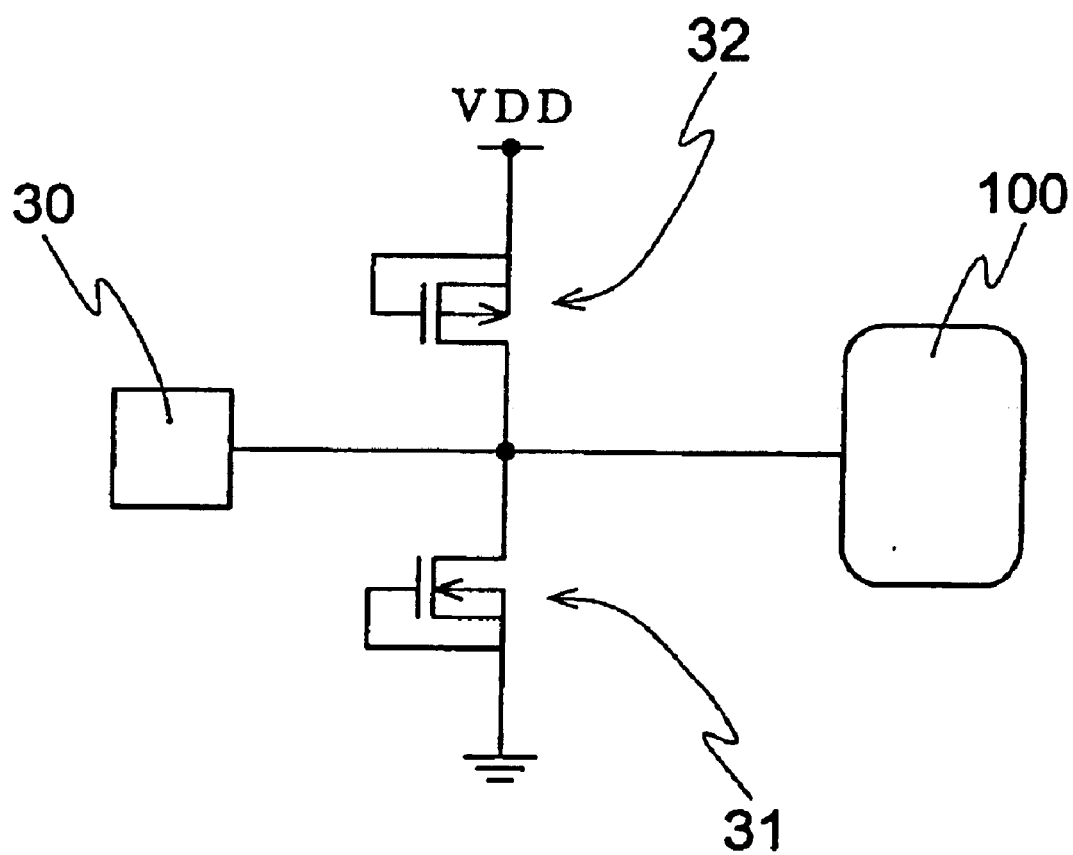
FIG. 2 is a circuit diagram illustrating an ESD protection circuit employing an MOS transistor in an OFF state.
Figure 3:
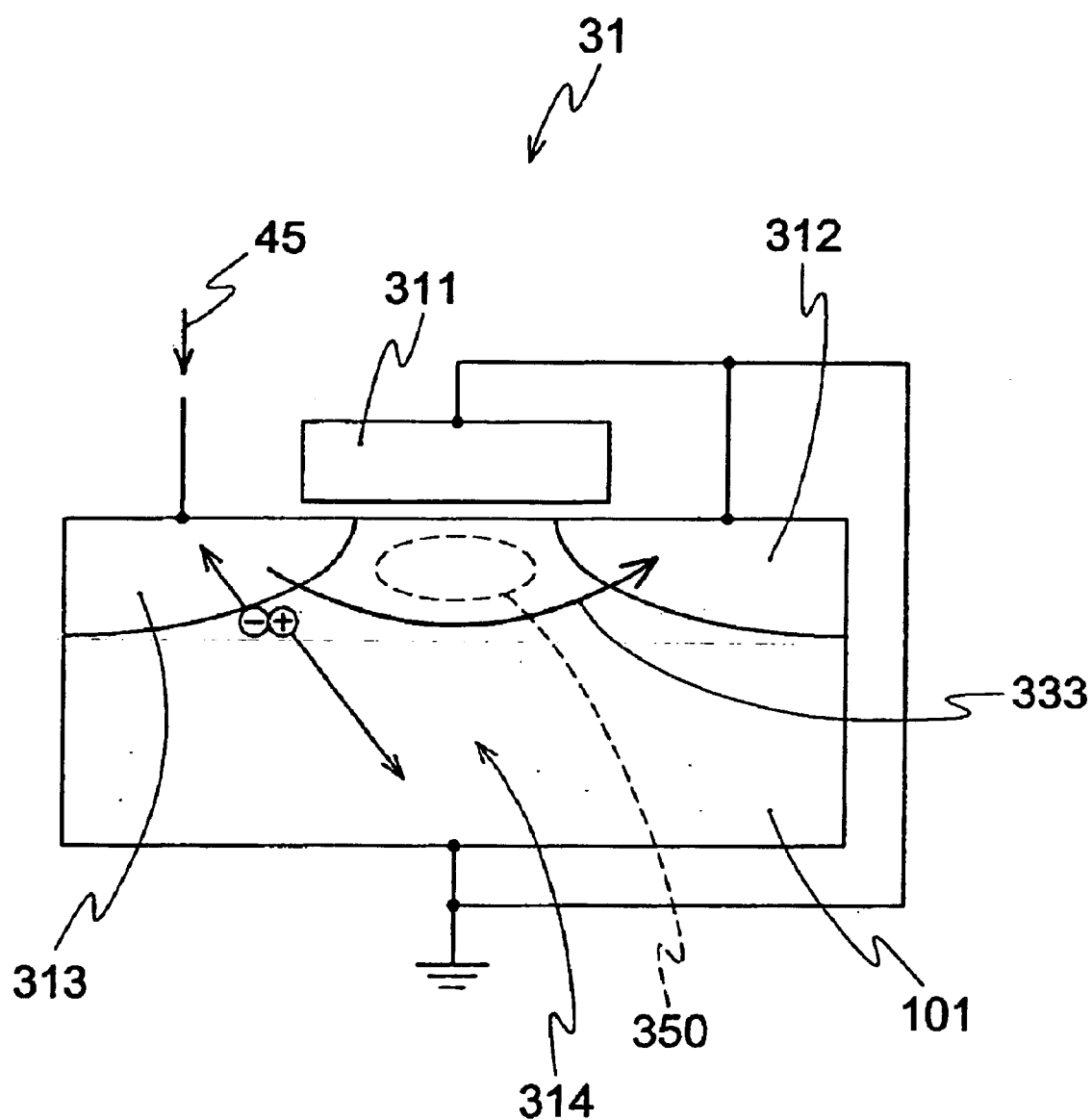
FIG. 3 is a figure describing parasitic bipolar transistor action of MOS transistors.
Figure 4:
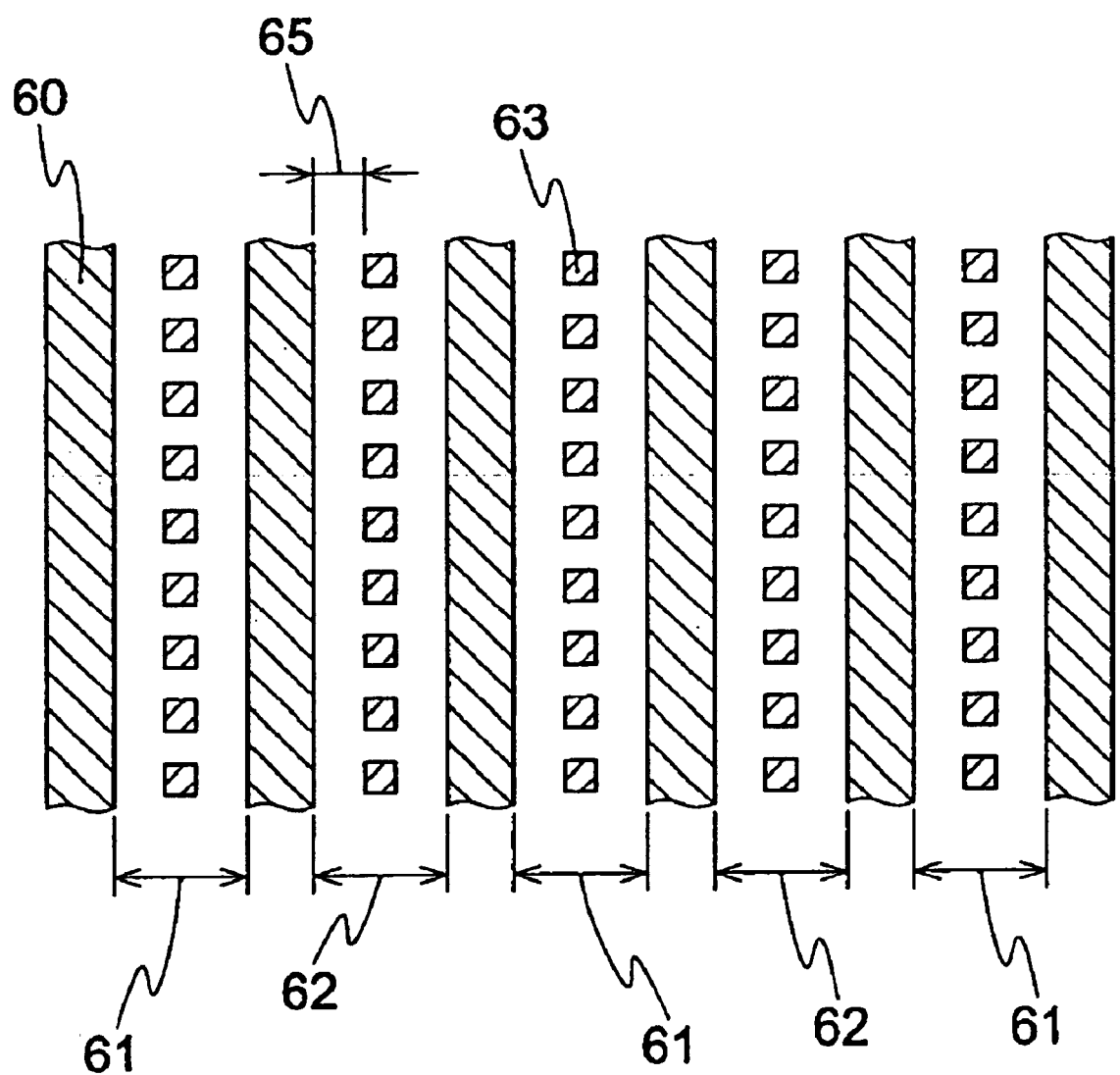
FIG. 4 is a figure illustrating the distance between the gate and the contact of the MOS transistor.
Figure 5:
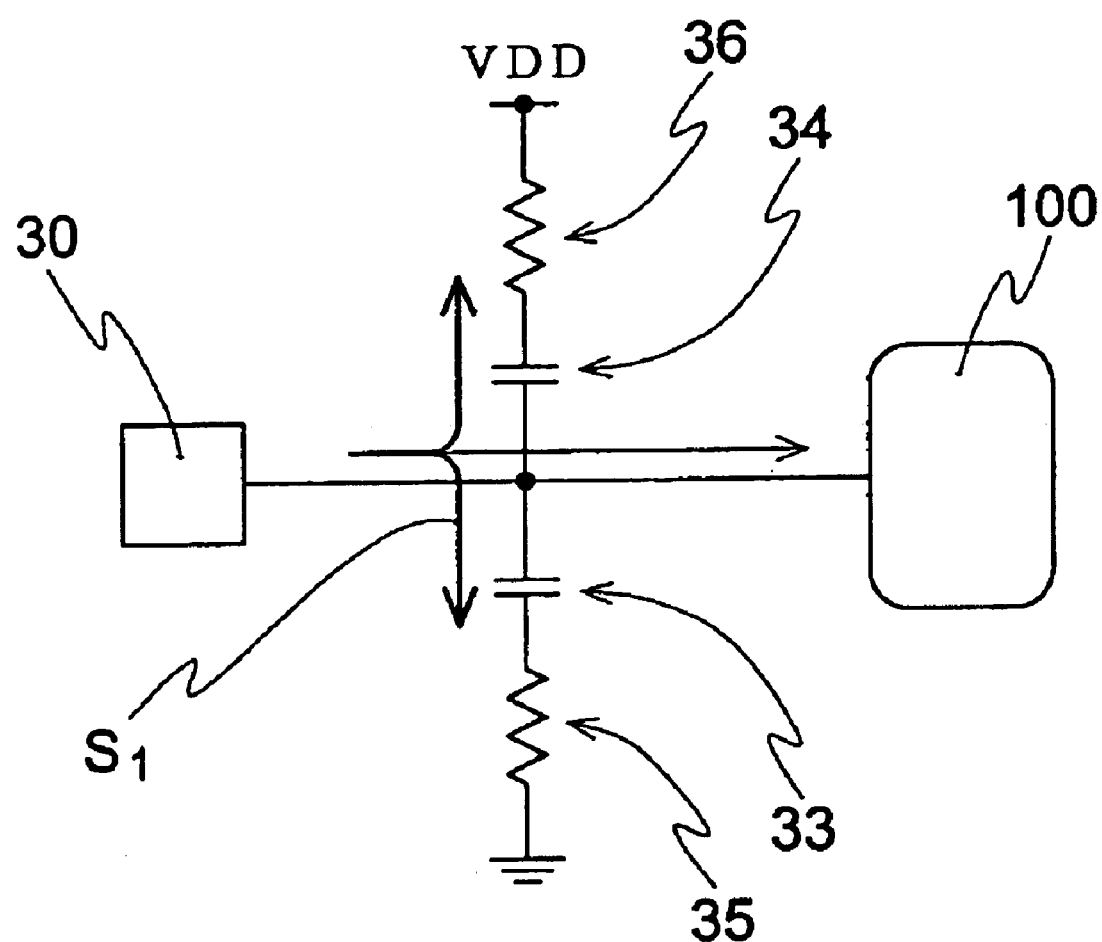
FIG. 5 is an equivalent circuit diagram describing outflow of high-frequency signal through the capacitor of the drain diffusion layer of the MOS transistor.
Figure 6A:
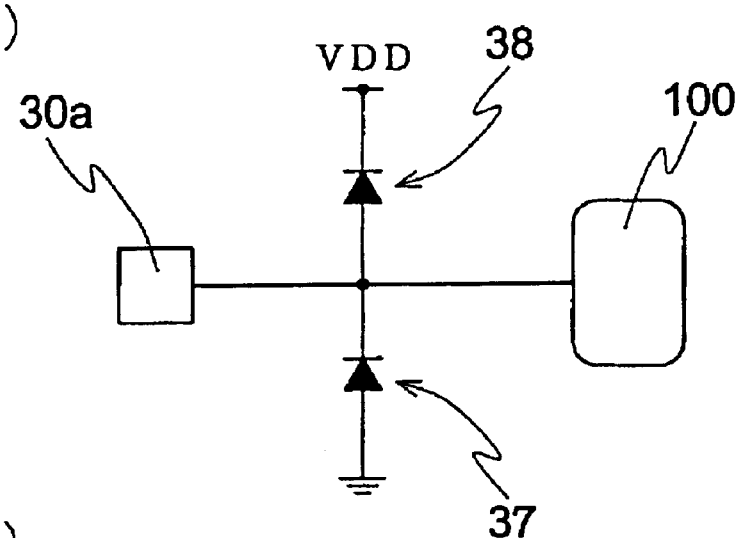
FIGS. 6(a)–6(c) are circuit diagrams showing an ESD protection circuit according to the present invention.
Figure 6B:
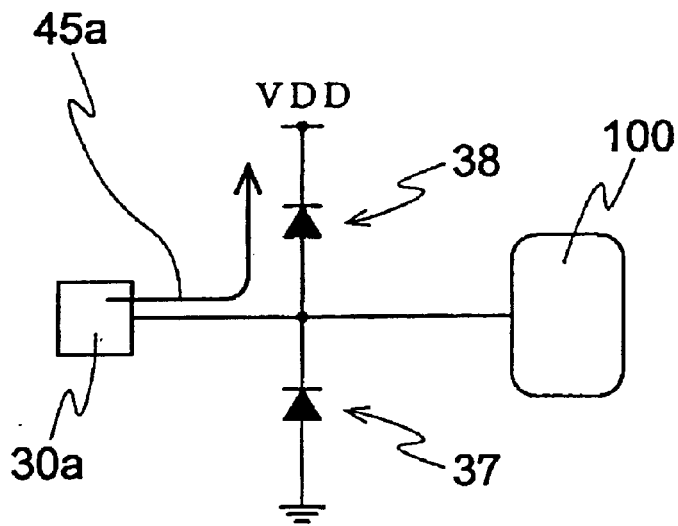
Figure 6C:
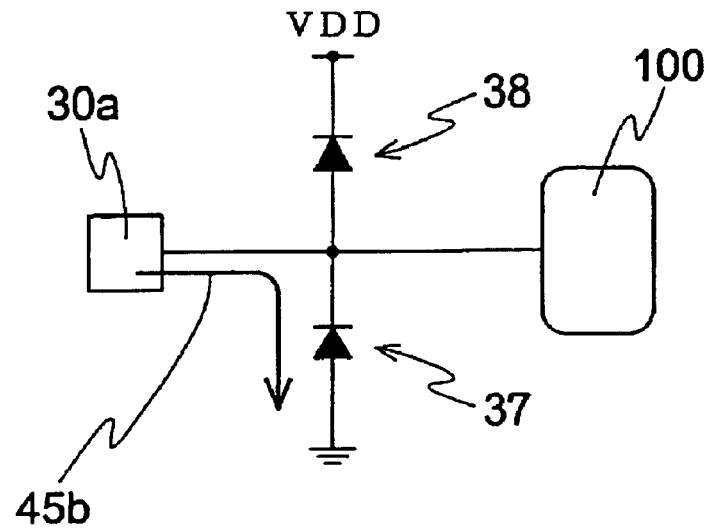
Figure 7A:
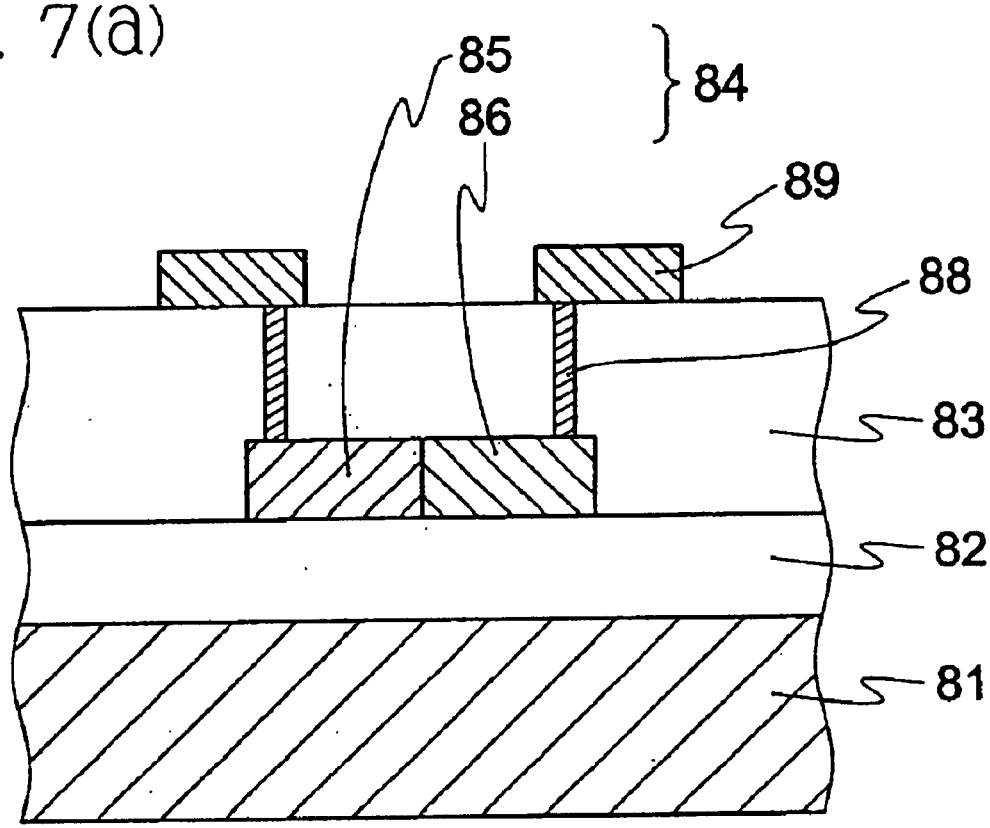
FIG. 7(a) is a sectional view of the lateral polysilicon diode.
Figure 7B:
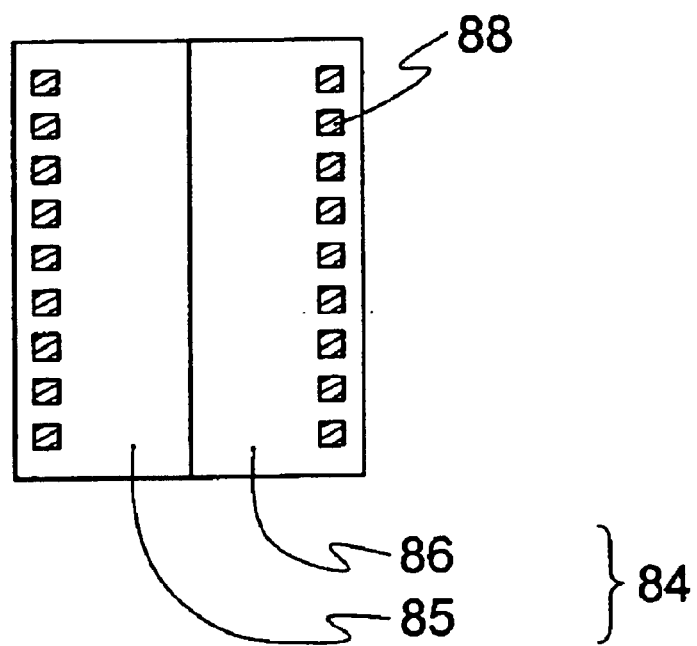
FIG. 7(b) is a top view of it.

FIGS. 6(a)–6(c) show an arrangement of an ESD protection circuit for a high-frequency semiconductor device according to the present invention. FIGS. 7(a) and 7(b) show the structure of an ESD protection element. In the ESD protection circuit according to the present embodiment, the lateral polysilicon diodes, which are formed with polysilicon (polycrystalline silicon) for forming gate electrodes of the Si-MOS transistor, are employed. By the lateral polysilicon diodes, the clamp circuit for ESD is composed.

ESD protection through clamp circuit employing diodes is well known, hereinafter the function will be described. Diode 38 is connected between signal line, which connects an I/O pad 30a and an internal circuit 100, and VDD (positive voltage supplied externally). The forward direction of the diode 38 is the direction from the signal line to the VDD as shown in FIG. 6(a). Further, another diode 37 is connected between GND and the signal line. The forward direction of the diode 37 is the direction from the GND to the signal line. When a positive voltage higher than VDD flows into the signal line in this diode clamp circuit, a diode 38 to which VDD is connected shall be turned ON and disperse the current toward the VDD. Until voltage of the signal line becomes lower than VDD, the diode 38 maintains its ON state. On the contrary, when a negative voltage lower than GND flows into the signal line, the diode 37 to which GND is connected shall be turned ON and disperse the current toward the GND. The diode 37 keeps ON state until a voltage of the signal line becomes higher than the GND. Thus, the clamp circuit can limit the voltage. Therefore, a positive high voltage ESD surge 45a impressed to the signal line shall be dispersed to the VDD via the diode 38 (FIG. 6(b)). On the other hand, a negative high voltage ESD surge 45b impressed to the signal line is dispersed to the GND via the diode 37 as shown in FIG. 6(c), thereby preventing the destruction of the internal circuit 100, to which the signal line is connected, from the ESD.

According to the article by A. Z. Wang et.al. "IEEE BCTM pp.46 to 49. 1999" (hereinafter article 3), the clamp circuit employing diodes also has serious disadvantages. In a case where the voltage of VDD is impressed to the signal line at normal operation wherein no ESD is occurred, the voltage of the signal line may be certain higher than VDD due to that supplied VDD varies (Normally, variation of ±10% is permitted in the industrial standard). In this case, the diode connected to VDD is turned ON, and a large leakage current flows through the diode. Therefore, it was difficult to use the clamp circuit employing diode for ESD protection.

Figure 8:
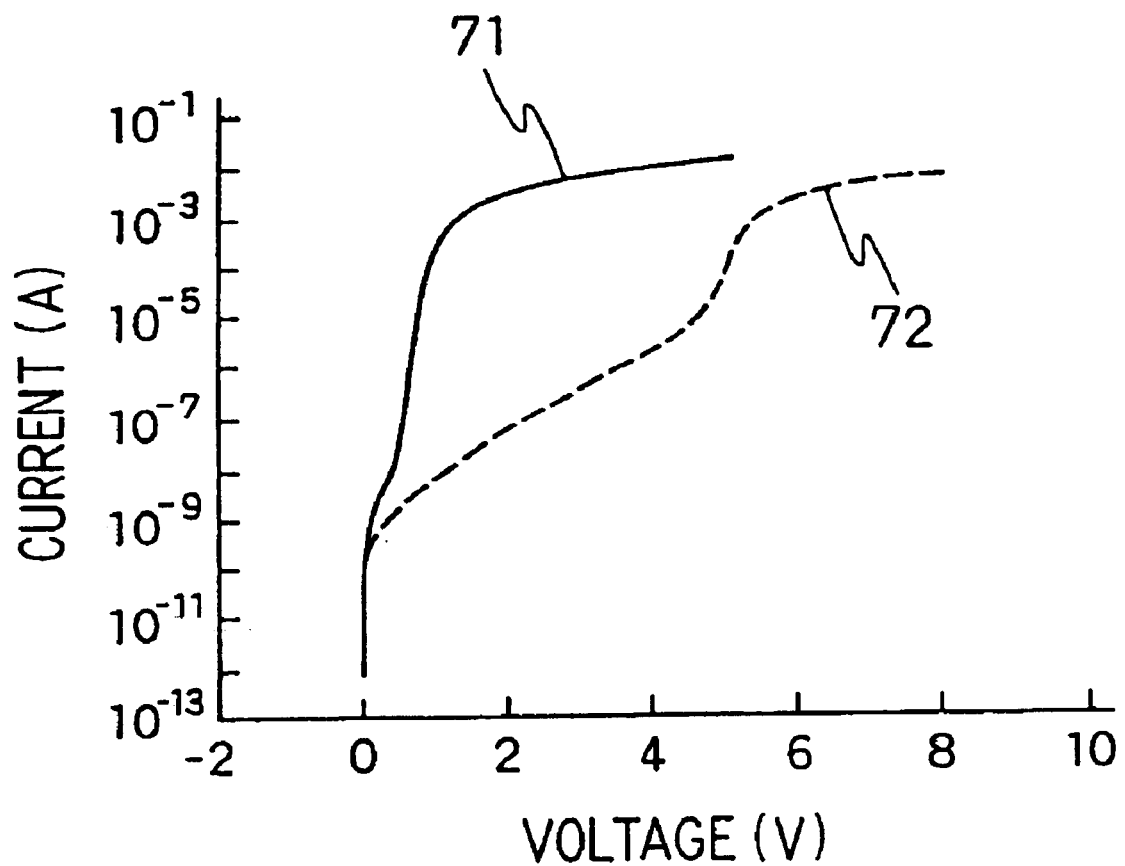
FIG. 8 shows a voltage-current characteristic of a lateral polysilicon diode.

Next, the description of lateral polysilicon diodes which is employed in the present invention is given. As shown in the FIG. 7, the lateral polysilicon diodes is made by forming PN junction laterally with forming P-type region 85 and N-type region 86 by injecting ion into a polysilicon film 84 which is formed on an insulating layer 82 of silicon oxide. As presented in the article by M. Dutoit et.al. "J. Electrichem. Soc. Vol.125, No.10, pp.1648 to 1651,1978" (hereinafter article 4), lateral polysilicon diodes has been studied since 1970's. Other than the article 4 by M. Dutoit et.al., many studies has been done. As an example of application to the semiconductor device, the article of Y. Miyawaki et.al. "IEEE J. Solid-State Circuits, vol.34, pp.1551 to 1556, November 1999" (hereinafter article 5) in which step-up circuit of flash memory which is a nonvolatile memory is enumerated. As shown in the study examples, lateral polysilicon diodes have an advantage that their parasitic capacitances is small because they are isolated from the Si substrates by the insulating layer of silicon oxide or the like. In the application to the step-up circuit of the flash memory shown in the article 5, a high efficiency step-up circuit is achieved with taking an advantage that there is no body effect with the lateral polysilicon diodes. Although the lateral polysilicon diodes have such advantages, they also have a serious problem as revealed in the many researches. That is, unlike to monocrystal silicon, polysilicon has a lot of defects and large grain size so that deep trap of energy level is formed and a reverse bias leakage current 72 is very large as shown in FIG. 8. In FIG. 8, forward bias leakage current 71 is also shown for reference. Though the monocrystal silicon shows ideal diode characteristics, since large current is leaked as shown in FIG. 8, the lateral polysilicon diodes could not be applied for a semiconductor logic device in which lower power consumption and lower leakage current are required. It was not also possible to apply to the semiconductor logic device because the leakage current causes mis-operation such as inversion between "1" and "0". Further, a problem concerning with durability is critical. Polysilicon, which has a lot of defectives by nature of polycrystal, was not ensure reliability for enduring ON/OFF switching frequencies expected in life of ten years as typical semiconductor devices. Therefore, the lateral polysilicon diodes can not be applied to the logic device in view of reliability. In the article 5, lateral polysilicon diodes are applied not to a general circuit of the flash memory but to the step-up circuit. In the step-up circuit, large leakage current of lateral polysilicon diodes is not problematic. Moreover, the step-up circuit only operates during writing and deleting of the flash memory, so that frequencies of ON/OFF switching is several digits fewer than that of typical semiconductor device. Only for the step-up circuit supporting these conditions, the lateral polysilicon diodes can be applicable.

As described above, it was difficult to use a diode, especially a lateral polysilicon diode, as an element for the ESD protection circuit conventionally. The present invention is directed to solve these problems in the prior art through the following methods, and achieve a sophisticated and highly reliable semiconductor device having high ESD resistance in the high-frequency device employing with Si-MOS transistor for the first time.

In the present invention, a clamp circuit which employs lateral polysilicon diodes as ESD protection elements is attached only to high-frequency I/O signal line among all I/O signal lines of the high-frequency device employing with Si-MOS transistor. The prior art ESD protection circuit may be attached to other signal line with no high-frequency signals.

In the high-frequency I/O signal line, the DC bias voltage can be set to any preferable voltage. Therefore it is possible to apply certain voltage between VDD and GND instead of VDD as the DC bias voltage. By designing a bias circuit in such manner, a voltage of signal line shall not become higher than VDD even if VDD varies. As a result, a problem discussed in the article 3 in which diode is turned ON due to the variation of VDD in the clamp circuit employing diode can be solved. Therefore, the clamp circuit employing with diodes can be applied for the ESD protection.

Moreover, the high-frequency I/O signal line to which the lateral polysilicon diodes is connected supplies only bias voltage as DC circuit operation, therefore it shall not cause mis-operation even if a large reverse bias leakage current flows through the lateral polysilicon diodes. Therefore, the reverse bias leakage current in the lateral polysilicon diodes has not cause a problem so that the lateral polysilicon diodes can be used as protection element of clamp circuit. Though the bias voltage on the high-frequency circuit varies depend on the reverse bias leakage current, the bias voltage can be set with assuming this variation caused by the reverse bias leakage current. Thus, a large reverse bias leakage current of the polysilicon diode has no influence on the high-frequency characteristic of the signal line and the internal circuit at all, thereby preventing mis-operation to realize highly reliability. Again it should be noted, as mentioned above, lateral polysilicon diodes could not be used as a protection element for clamp circuit in the logic device that operates at DC voltage.

The ESD protection element operates only when ESD surge is impressed, so it requires much fewer reliability than that of the logic element which switches frequently. Therefore, it becomes possible to use lateral polysilicon diodes, which had not been ensured reliability for enduring ON/OFF switching operation to be expected in ten years since it includes a lot of defects due to the polycrystal, as ESD protection element.

The use of the lateral polysilicon diodes as ESD protection element decrease the parasitic capacitances between the diode and Si substrates, i.e. wells, dramatically, thereby preventing high-frequency signal leaking into the Si substrate of low resistance via the parasitic capacitances. As shown in FIG. 7, the cross wise length of the lateral polysilicon diodes is determined with the region to form PN junction and the region to form electrodes for P-type and N-type region 85 and 86 (that is, the required region to form a contacts 88 connected to P-type and N-type regions 85 and 86) and it is approximately 5 $\mu$m at most. With assuming width of the diode to be 100 $\mu$m as same as the above example of the MOS transistor, it could be thought that a conductor having its area S=500 $\mu$m$^2$ (S=5 $\mu$m×100 $\mu$m) is counterposed to Si substrate interposing the insulating layer of silicon oxide. With assuming the thickness "d" of the insulating layer to be 0.35 $\mu$m, the parasitic capacitances "C" between Si substrate and the conductor, i.e. the lateral polysilicon diodes, is obtained by the equation C=$\epsilon_{ox}$·d/S ($\epsilon_{ox}$ is a dielectric constant of insulating layer (SiO$_2$)), so the capacitance C is 0.05 pF for one diode. The value is reduced to 1/20(0.5%), compared with 1.02 to 1.22 pF of the parasitic capacitances for MOS transistors in the prior art ESD protection circuit. It means that impedance due to the parasitic capacitances becomes 20 times or more than that of ESD protection element employing with MOS transistor at high-frequency, thereby preventing completely that high-frequency signals are passed through the parasitic capacitances and flow into the Si substrate. Thus, loss of the signal at the low resistance Si substrate shall be decreased dramatically. Accordingly it is achieved a sophisticated and highly reliable high-frequency semiconductor device having high ESD resistance, preventing destruction of Si-MOS transistor in the device without deteriorating high frequency characteristics.

Figure 9:
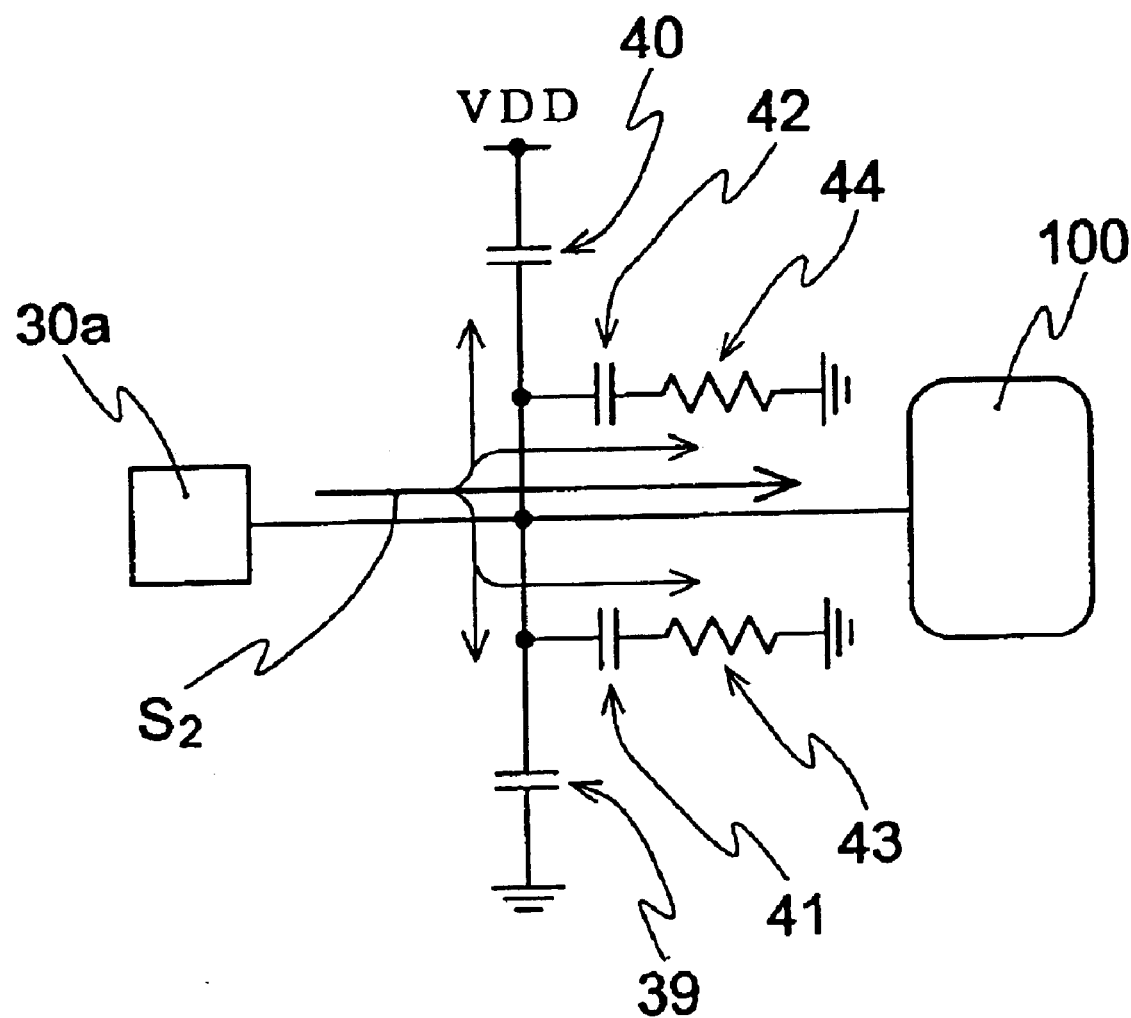
FIG. 9 shows an equivalent circuit for describing outflow of a high-frequency signal through the parasitic capacitance of an Si substrate and through the depletion layer capacitance.

As the parasitic capacitances along with lateral polysilicon diodes, there is depletion layer capacitance 39 and 40 of PN junction in addition to parasitic capacitances 41 and 42 between a Si substrate as shown in equivalent circuit diagram of FIG. 9. In a case where PN junction is made by the following methods, the impurity concentration often becomes very high such as approximately 10$^{20}$ cm$^{-3}$, and depletion layer capacitance becomes relatively high. In a case where lateral polysilicon diodes is used for the prior art semiconductor device, the total parasitic capacitances, including the depletion layer capacitance, is important. However, as mentioned above, in the high frequency device employing with Si-MOS transistor, in which loss of the high-frequency signals at the low resistance Si substrate (diagrammatically shown as resistances 33 and 34 in FIG. 9) shall cause a problem, it is more important to reduce the parasitic capacitances between Si substrate.

Therefore, by employing with clamp circuit using lateral polysilicon diodes as ESD protection circuit, the present invention satisfies the request, raised with the high-frequency semiconductor device employing Si-MOS transistors, to reduce not total parasitic capacitances but the parasitic capacitances between the Si substrate. At the same time, as mentioned above, the present invention is also directed to and solves various problems preventing application of lateral polysilicon diodes in the prior art, and has new important effects and novelty.

As described above, the clamp circuit, which uses the lateral polysilicon diodes as an ESD protection element, is formed only on high-frequency I/O signal line among all I/O lines of the high-frequency device employing with Si-MOS transistor, thereby preventing destruction of Si-MOS transistor without causing mis-operation and deteriorating high frequency characteristics. Therefore a sophisticated and highly reliable high frequency semiconductor device with high ESD resistance is achieved.

EMBODIMENT 2

Figure 10:
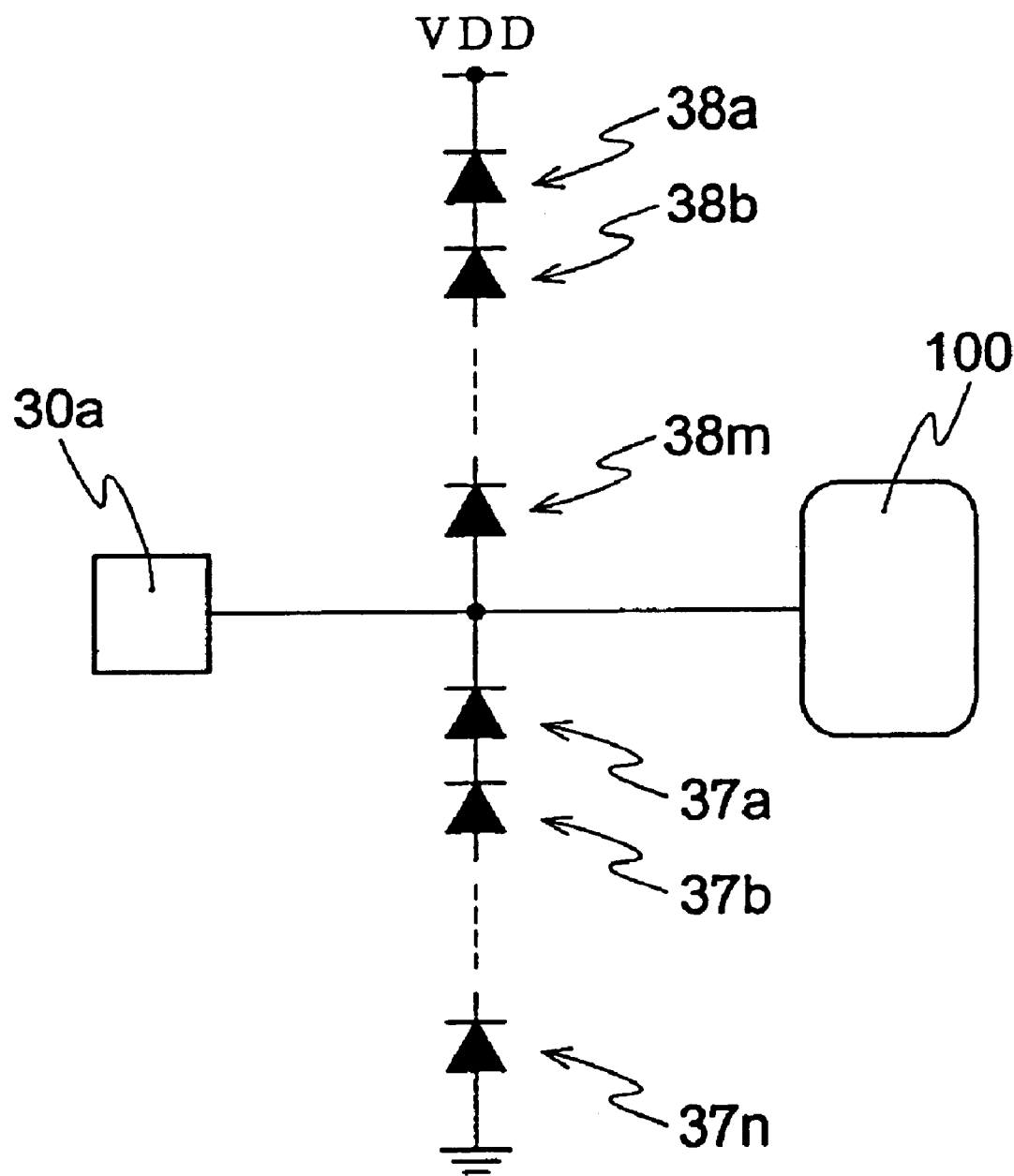
FIG. 10 is a figure showing ESD protection circuit according to the present embodiment.

In the present embodiment, as shown in FIG. 10, "m" pieces of lateral polysilicon diodes 38a, 38b, . . . , 38m are connected in series between high-frequency I/O signal line which connects high-frequency signal I/O pad 30a with the internal circuit 100 and VDD (positive voltage supplied externally). The forward direction of these diodes is the direction from the high-frequency I/O signal line to the VDD. Further, "n" pieces of lateral polysilicon diodes 37a, 37b, . . . , 37n are connected in series between the ground (GND) and the high-frequency I/O signal line. The forward direction of these diodes is the direction from the GND to the high-frequency I/O signal line.

With representing the voltage of VDD as $V_{dd}$, the total number (m+n) of lateral polysilicon diodes is desired to meet the following equation (1).

$$V_{dd}/(m+n)<1.1[V] \qquad \text{equation (1)}$$

Figure 11A:
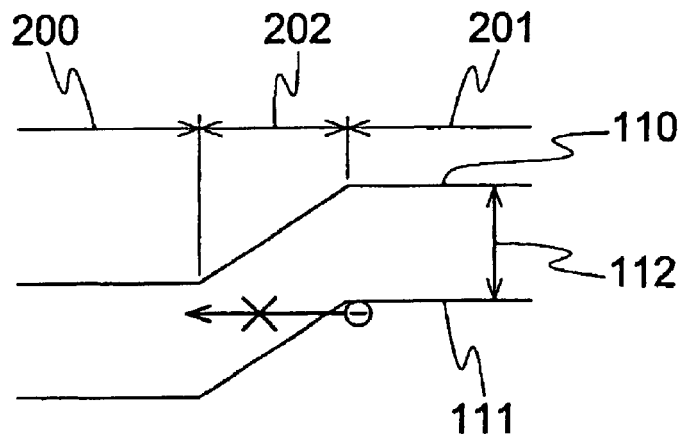
FIGS. 11(a)–11(c) show the influence of the presence of traps at deep energy levels in tunneling between bands.
Figure 11B:
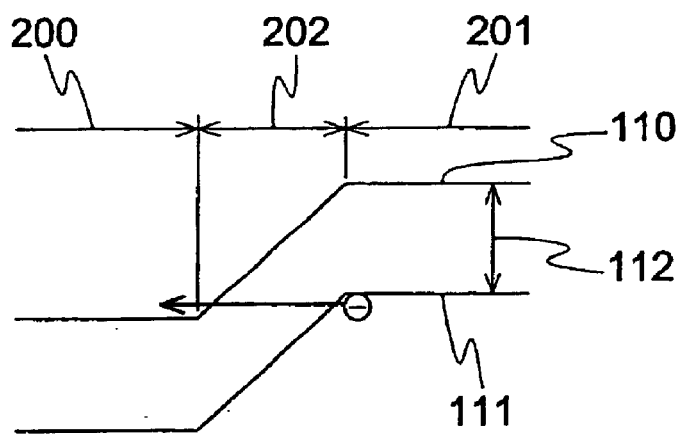
Figure 11C:
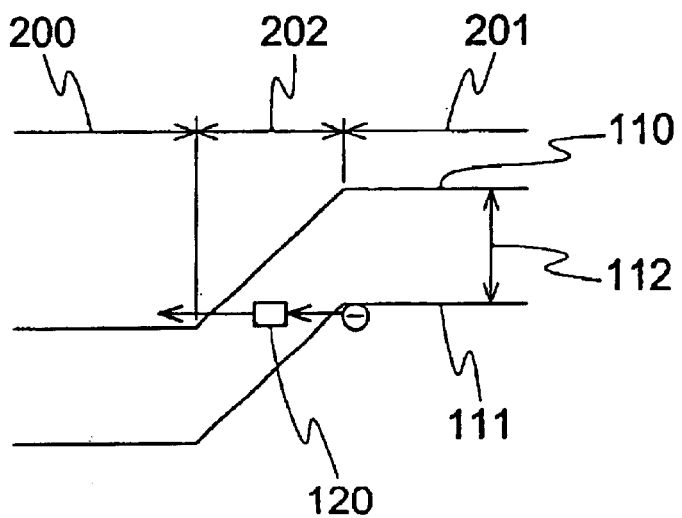

In the lateral polysilicon diode, PN junction is formed laterally. But practically, as described in later, a "i" region in which few or no impurities are doped is typically formed between "P" and "N" region to improve characteristic of diode. Because of this PIN junction, such a diode is called PIN diode and appears in the article of S. M. Sze, "Physics of Semiconductor Devices pp.117" (hereinafter article 6) for example. When a voltage is applied to the PIN type lateral polysilicon diodes, most of applied voltage is impressed to "i" region of high resistance. When it is assumed that a reverse voltage is impressed, and the impressed voltage to the "i" region becomes larger than band gap voltage of Si (approx. 1.1 [V]), energy band shall be shifted larger than the band gap of Si in the "i" region, thereby causing so called "tunnel effect" in which electrons in valence band passes through to conductive band (FIG. 11(b)). This is called "the tunnel effect between bands" as described in the publication entitled "Flash memory technological handbook" from science forum Inc. (hereinafter article 7). As mentioned above, polysilicon has a lot of defects and large grain size so that deep trap of energy level is formed. Thus, when the tunnel effect between bands are caused, leakage current at reverse bias shall be increased dramatically with encouraging generation of tunnel current via these deep trap of energy levels (refer to the FIG. 11(c)).

In the present embodiment, plurality of diodes are connected in series to configure a clamp circuit so that a reverse bias voltage impressed to each diode is less than band gap voltage of Si. Therefore tunnel effect between bands is prevented, thereby reducing DC current consumption with reducing reverse leakage current of the lateral polysilicon diodes. In the prior art, when plural number of diodes are connected in series, required voltage to turn ON the diodes is doubled, tripled, . . . , and results in increasing of power consumption. Further, diodes may not be turned ON since the required turn ON voltage becomes higher than the external supply voltage. According to the present invention, only reverse bias is impressed to the diode during ordinary operation of the device, and forward voltage is impressed when ESD is occurred. A surge voltage due to ESD is extremely higher than turn ON voltage of the diodes in series, therefore, the diodes is turned ON to flow current through them so as to protect the internal circuit from ESD. Thus, according to the present invention, it becomes possible to apply series connected diodes for the first time.

As described above, by applying the clamp circuit wherein lateral polysilicon diodes is employed as an ESD protection element only for the high-frequency I/O signal line among all I/O lines of the high-frequency device employing Si-MOS transistor circuit, it becomes possible to prevent destruction of Si-MOS transistor circuit element due to ESD without causing mis-operation and deteriorating high frequency characteristics. Therefore, a sophisticated and highly reliable high frequency semiconductor device with high ESD resistance is achieved.

The clamp circuit, wherein plurality of diodes are connected in series and therefore only applicable as ESD protection circuit, prevent a tunnel effect between bands when the lateral polysilicon diodes are reversely biased, thereby reducing reverse bias leakage current results in reduction of DC current consumption.

EMBODIMENT 3

As for Embodiments 1 and 2, the clamp circuits of lateral polysilicon diode(s) are attached between the VDD and the signal line and between the GND and the signal line. However, the clamp circuit of lateral polysilicon diode(s) may be attached only to either of them, i.e. between the VDD and the signal line or between the GND and the signal line. The clamp circuit of lateral polysilicon diode(s) may be attached to either of them, and the prior art clamp circuit may be attached to another.

EMBODIMENT 4

The manufacturing process of the high-frequency semiconductor device of embodiments 1, 2, and 3 are described referring to FIGS. 12(a)–17(b). FIGS. 12(a)–17(c) show a manufacturing process of high-frequency semiconductor device in which an NMOS transistor, a PMOS transistor, and lateral polysilicon diodes are formed on region 91 for NMOS, region 92 for PMOS, and region 93 for diodes, respectively.

Figure 12A:
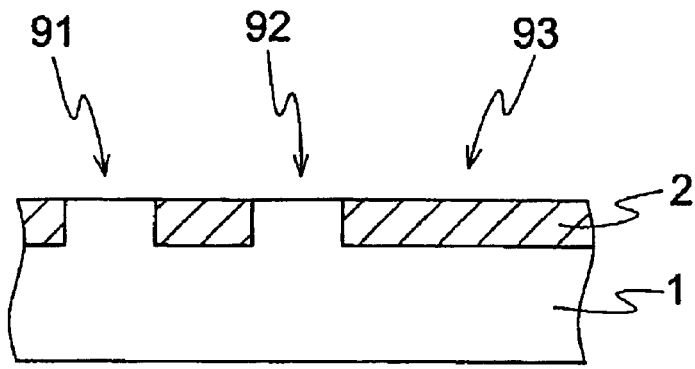
FIGS. 12(a)–12(c) show the manufacturing process of the high-frequency semiconductor device according to the present invention.

First of all, oxide film 2 for separation and insulation is formed on the Si substrate 1, and further, wells are formed at the region 91 and 92 by ion implantation (FIG. 12(a)).

Figure 12B:
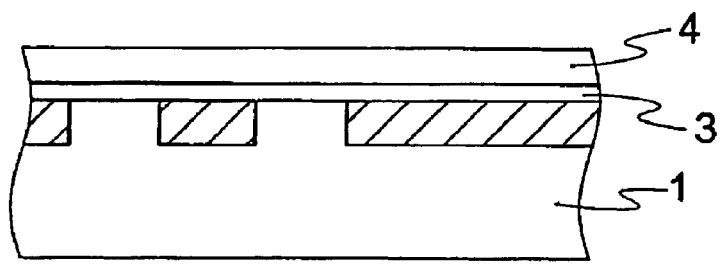
Figure 12C:
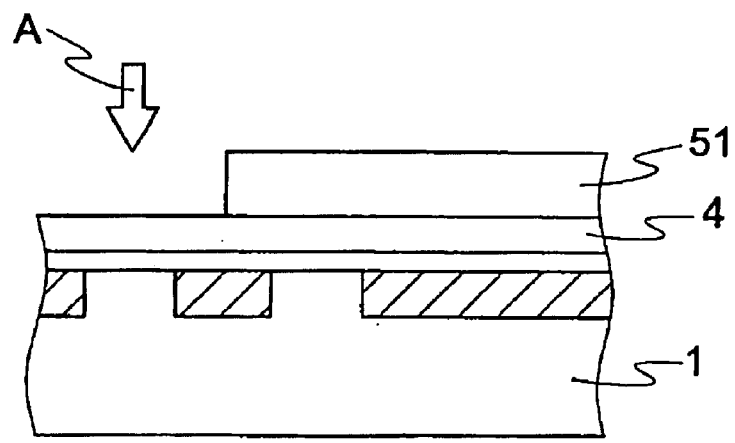

Next, a gate insulating film 3 is formed, and further, a non-doped polysilicon layer 4 is formed (FIG. 12(b)).

Then a resist pattern 51 is formed, and impurity ion is injected into exposed region of the polysilicon layer 4 which is to be a gate electrodes of NMOS transistor as shown by arrow A. (FIG. 12(c)).

Figure 13A:
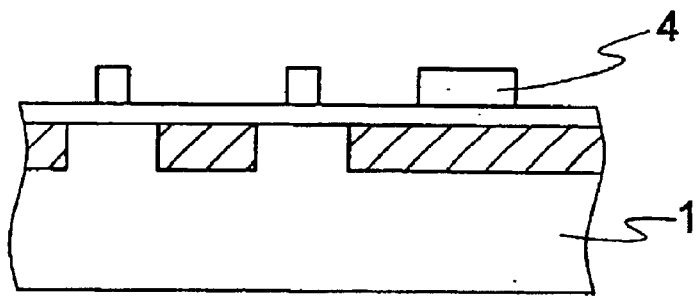
FIGS. 13(a)–13(c) show the manufacturing process following FIG. 12(c)

The resist pattern 51 is removed, and the polysilicon layer 4 is patterned to leave regions to be gate electrode of NMOS transistor, gate electrode of PMOS transistor and lateral polysilicon diodes with using another resist pattern (not shown) (FIG. 13(a)).

Figure 13B:
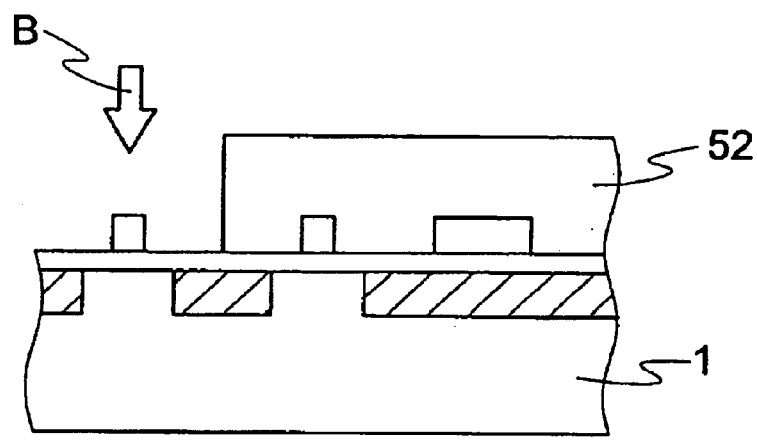

Resist pattern 52 is formed, and as shown by arrow B in the figure, ion implantation is carried out for forming LDD structure at source and drain of NMOS transistor (FIG. 13(b)).

Figure 13C:
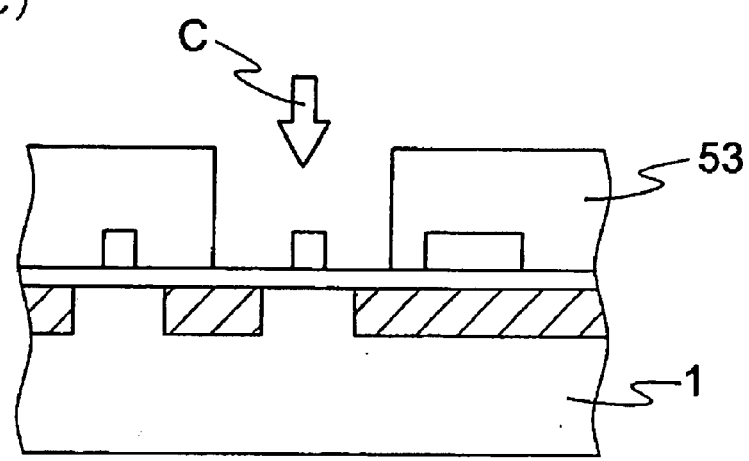

The resist pattern 52 is removed and a resist pattern 53 is formed, and as shown by arrow C, ion implantation is carried out for forming LDD structure at source and drain of PMOS transistor (FIG. 13(c)).

Figure 14A:
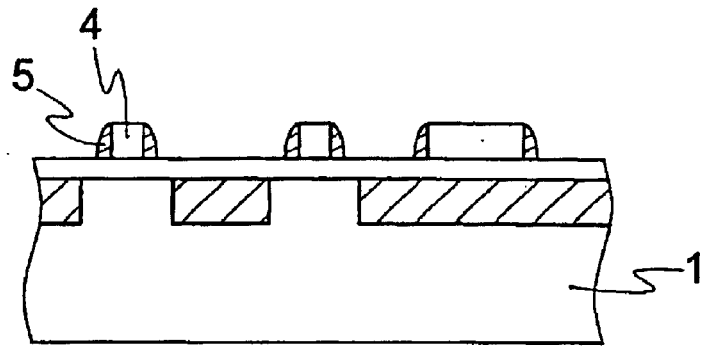
FIGS. 14(a)–(c) show the manufacturing process following FIG. 13(c)

The resist pattern 53 is removed and dielectric film sidewall 5 are formed on the lateral side of the polysilicon layer 4(FIG. 14(a)).

Figure 14B:
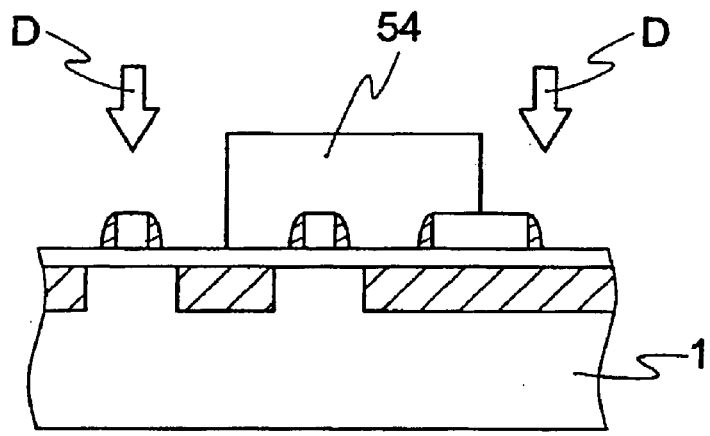

After that, resist pattern 54 is formed, and simultaneously with ion implantation into source and drain of NMOS transistor, ions are injected into a N-type region of the lateral polysilicon diodes as shown by arrow D (FIG. 14(b)).

Figure 14C:
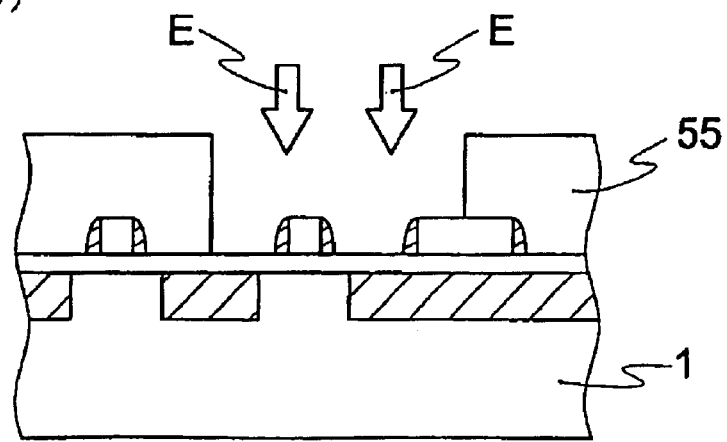
Figure 15:
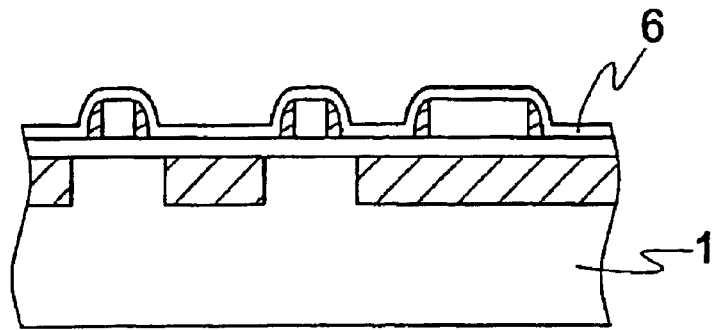
FIGS. 15(a)–15(c) show the manufacturing following FIG. 14(c)
Figure 15:
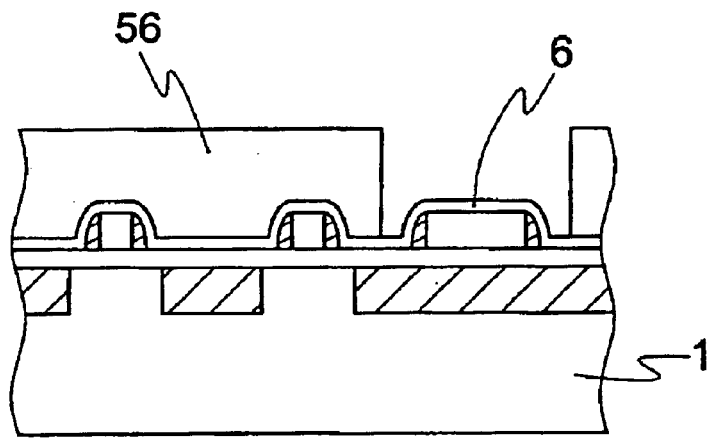
Figure 15:
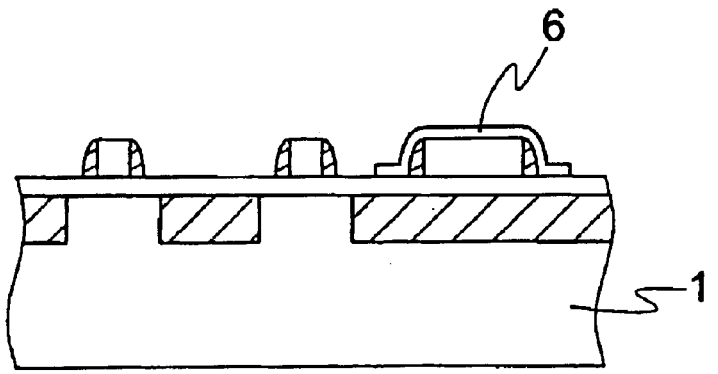
Figure 16:
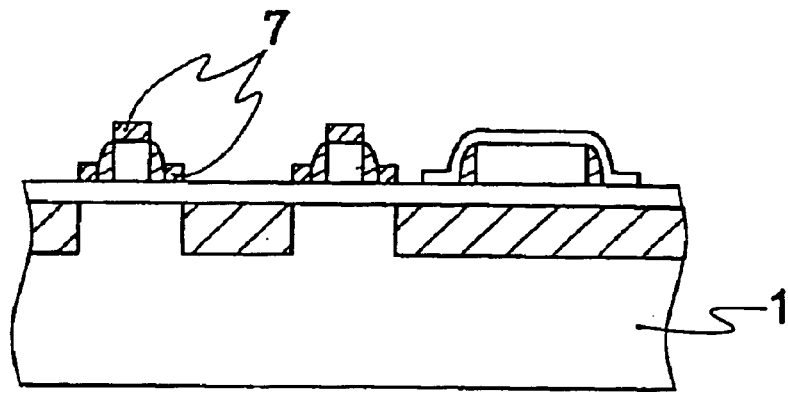
FIGS. 16(a) and 16(b) show the manufacturing process following FIG. 15(c)
Figure 16:
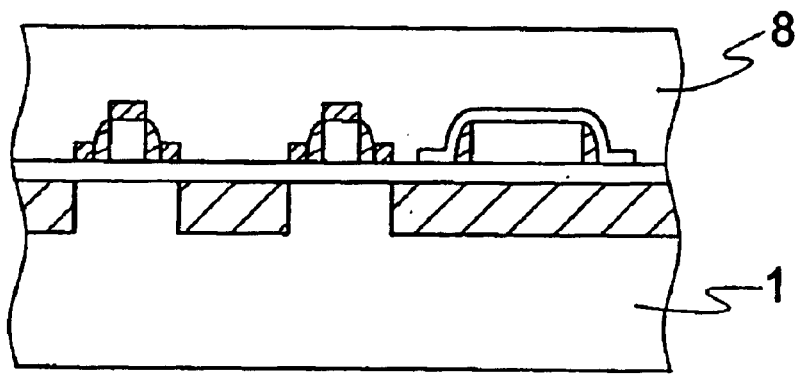
Figure 17:
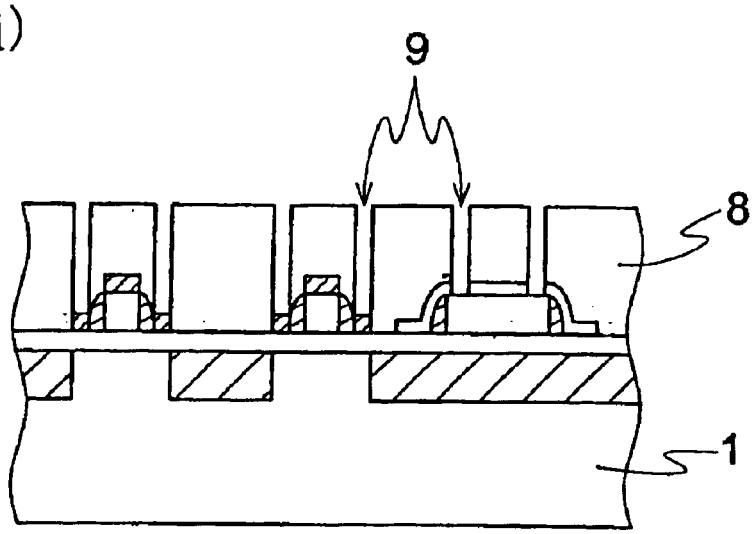
FIGS. 17(a) and 17(b) show the manufacturing process following FIG. 16(b)
Figure 17:
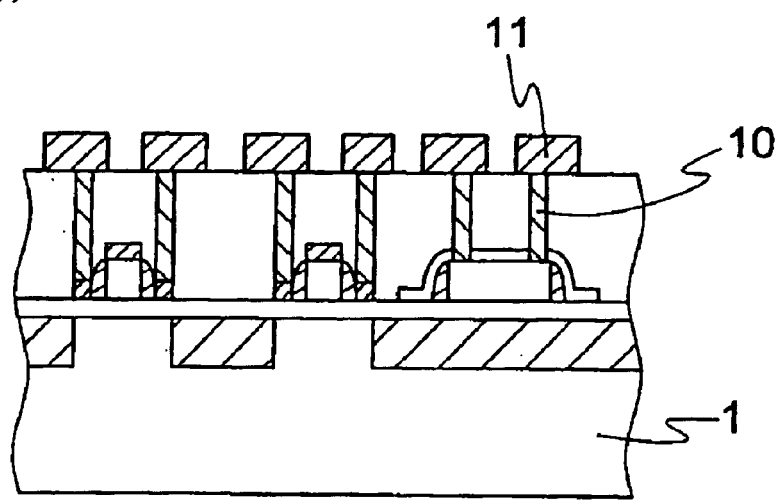

Resist pattern 54 is removed and another resist pattern 55 is formed, and simultaneously with ion implantation into source and drain of PMOS transistor, ions are injected into a P-type region of the lateral polysilicon diodes as shown by arrow E (FIG. 14(c)).

Resist pattern 55 is removed and insulating film 6 for preventing SALICIDE (self-aligned silicide) is layered (FIG. 15(a)). Then, resist pattern 56 is formed (FIG. 15(b)), and the insulating film 6 is patterned (FIG. 15(c)) so that the dielectric film 6 on NMOS and PMOS is removed.

Accordingly, silicide wiring 7 is formed on gates, sources and drains of NMOS transistor and PMOS transistor by self-aligned silicide formation.

Hereinafter, interlayer insulating film 8 is layered (FIG. 16(b)), and contact hole 9 for NMOS transistor, PMOS transistor and the lateral polysilicon diodes are formed in the interlayer insulating film 8 (FIG. 17(a)).

A contact 10 of conductive material are formed within the contact hole 9, then metal wiring 11 is formed (FIG. 17(a)).

Hereinafter, processes for depositing interlayer insulating film, forming contact hole and contact (it is generally called "via hole" and "via" in second and succeeding layer) and forming metal wiring are repeated required time, thereby forming metal wiring having required number of layers. By forming passivation film for protection on the metal wiring of the uppermost layer, and then removing the protection film on the I/O pad, finally high frequency semiconductor device is completed.

In the above-mentioned description, ion implantation for source and drain of PMOS and ion implantation for the gate electrode of PMOS are performed simultaneously. However, the impurity ion implantation for the gate electrodes of PMOS transistor can be carried out immediately after or before injecting impurity ion into the gate electrodes of NMOS transistor (FIG. 12(c)).

EMBODIMENT 5

Another example of the manufacturing process of the high-frequency semiconductor device of embodiments 1, 2, and 3 is described referring to FIGS. 18(a)–20(c). FIGS. 18(a)–20(c) show the manufacturing process of the high-frequency semiconductor device wherein an NMOS transistor, a PMOS transistor, and the lateral polysilicon diodes are fanned on the region 91 for NMOS, region 92 for PMOS, and region 93 for diodes, respectively.

Figure 18A:
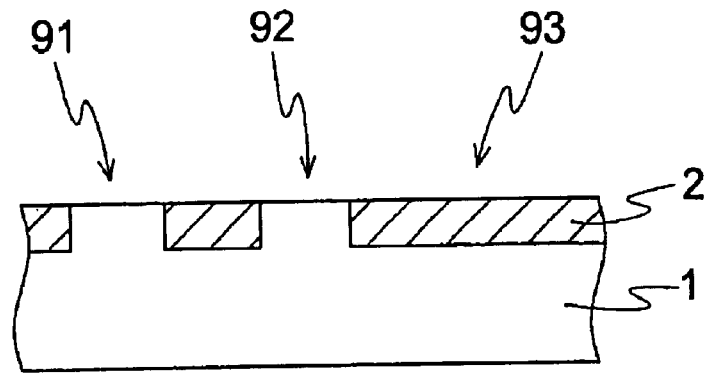
FIGS. 18(a)–18(c) show other manufacturing processes of the high-frequency semiconductor device according to the present invention.

First of all, the oxide film 2 for separation and insulation is formed on the Si substrate 1, and wells are formed at the region 91 and 92 by ion implantation (FIG. 18(a)).

Figure 18B:
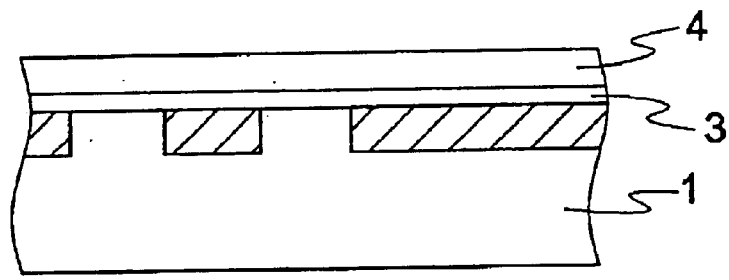
Figure 18C:
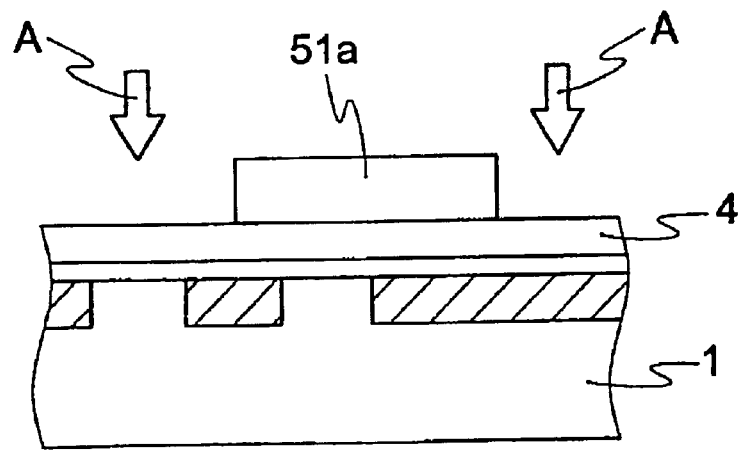

Next, the gate insulating film 3 is formed, and further non-doped polysilicon layer 4 is formed (FIG. 18(b)).

Then the resist pattern 51a is formed. Simultaneously with impurity ion implantation into exposed region of the polysilicon layer 4 which is to be a gate electrodes of NMOS transistor, ions are injected into a N-type region of the lateral polysilicon diodes as shown by arrow A (FIG. 18(c)).

Figure 19A:
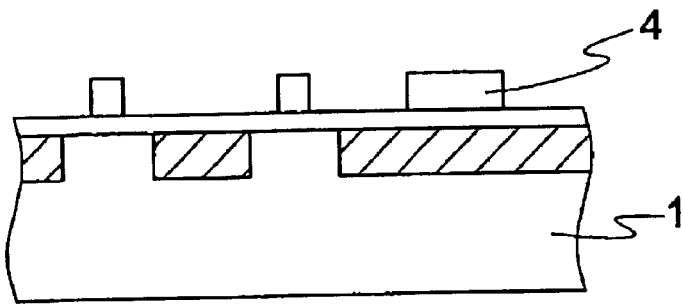
FIGS. 19(a)–19(c) show the manufacturing process following FIG. 18(c)

The resist pattern 51a is removed, and the polysilicon layer 4 is patterned to leave regions to be a gate electrode of NMOS transistor, a gate electrode of PMOS transistor and lateral polysilicon diode with using another resist pattern (not shown) (FIG. 19(a)).

Figure 19B:
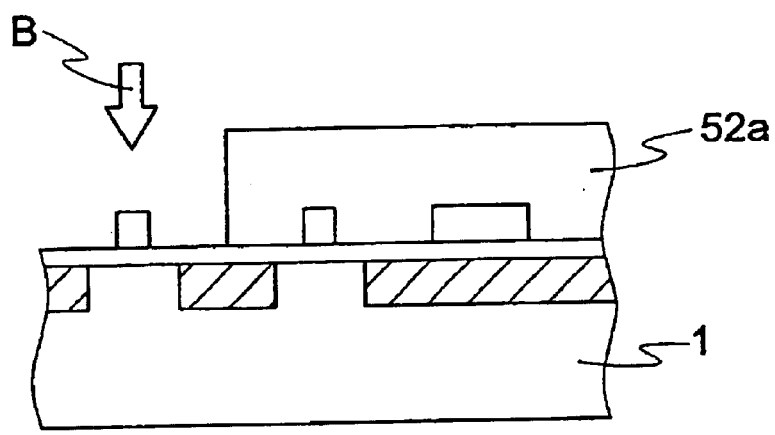

Resist pattern 52a is formed, and as shown by arrow B, ion implantation is carried out for forming LDD structure at source and drain of NMOS transistor (FIG. 19(b)).

Figure 19C:
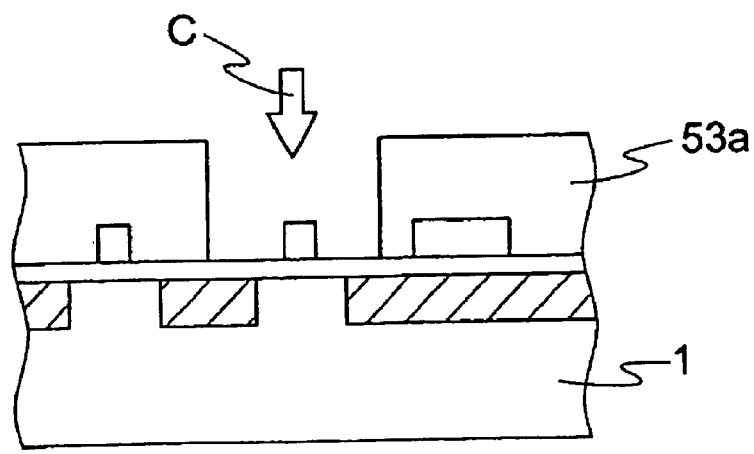

The resist pattern 52a is removed and another resist pattern 53a is formed, and as shown by arrow C in the figure, ion implantation is carried out for forming LDD structure at source and drain of PMOS transistor (FIG. 19(c)).

Figure 20A:
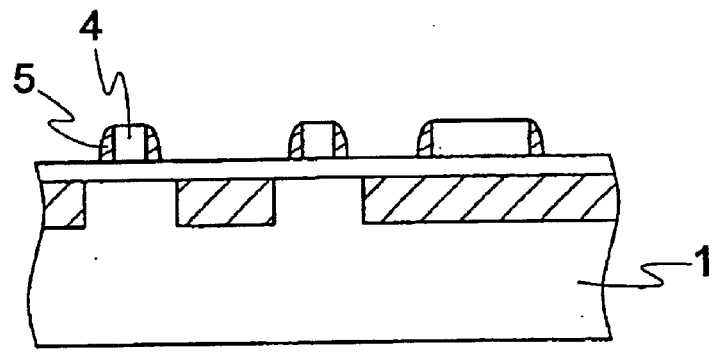
FIGS. 20(a)–20(c) show the manufacturing process following FIG. 19(c)

The resist pattern 53a is removed and dielectric film sidewall 5 are formed on the lateral side of the polysilicon layer 4 (FIG. 20(a)).

Figure 20B:
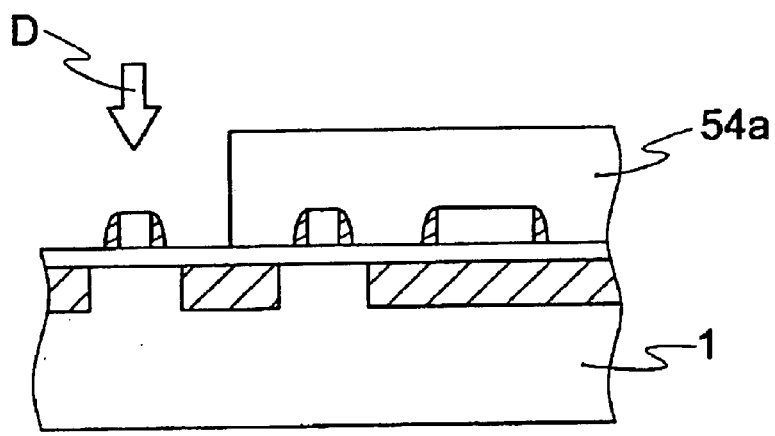
Figure 20C:
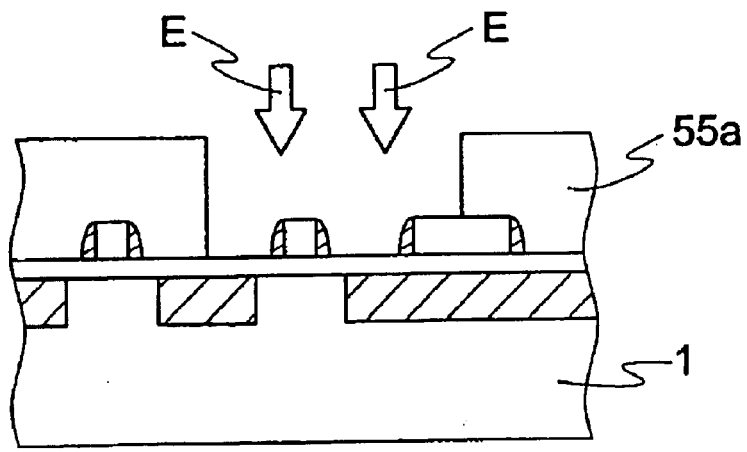

Resist pattern 54a is formed, ions are injected into source and drain of NMOS transistor as shown by arrow D (FIG. 20(b)).

Further, the resist pattern 54a is removed and another new resist pattern 55a is formed. And simultaneously with ion implantation into source and drain of PMOS transistor, ions are injected into a P-type region of the lateral polysilicon diodes as shown by arrow E (FIG. 20(c)).

Hereinafter, silicide wiring, interlayer insulting film, a metal wiring and a passivation film are formed in the same manner as the embodiment 4.

In the above-mentioned description, ion implantation for source and drain of PMOS transistor and ion implantation for the gate electrodes of PMOS are performed simultaneously. However, the impurity ion implantation for the gate electrodes of PMOS transistor can be carried out immediately after or before injecting impurity ion into the gate electrodes of NMOS transistor (FIG. 18(c)).

EMBODIMENT 6

Another manufacturing process of the high-frequency semiconductor device of embodiments 1, 2, and 3 is described referring to FIGS. 21 (a)–24(b). FIGS. 21 (a)–24 (b) show the manufacturing process of the high-frequency semiconductor device wherein an NMOS transistor, a PMOS transistor, lateral polysilicon diodes, and a capacitor are formed on the region 91 for NMOS, region 92 for PMOS, region 93 for diodes, and region 94 for a capacitor, respectively.

Figure 21A:
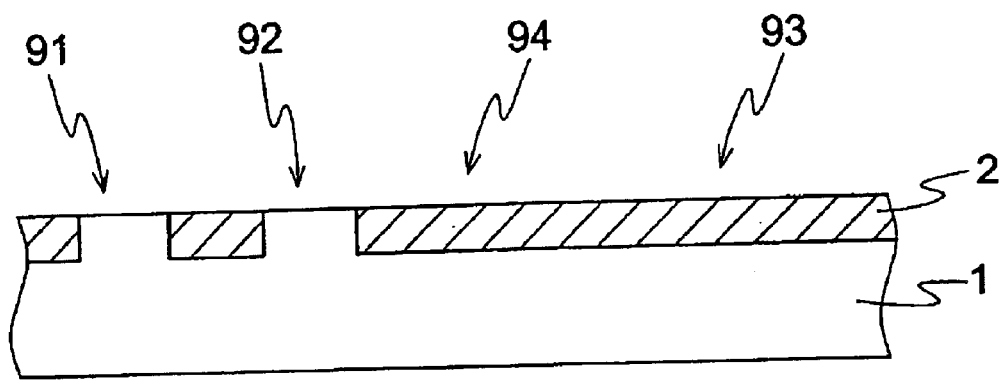
FIGS. 21(a)–21(c) show still other manufacturing processes of the high-frequency semiconductor device according to the present invention.

First of all, the oxide film 2 for separation and insulation is formed on the Si substrate 1, and wells are formed at the region 91 and 92 by ion implantation (FIG. 21(a)).

Figure 21B:
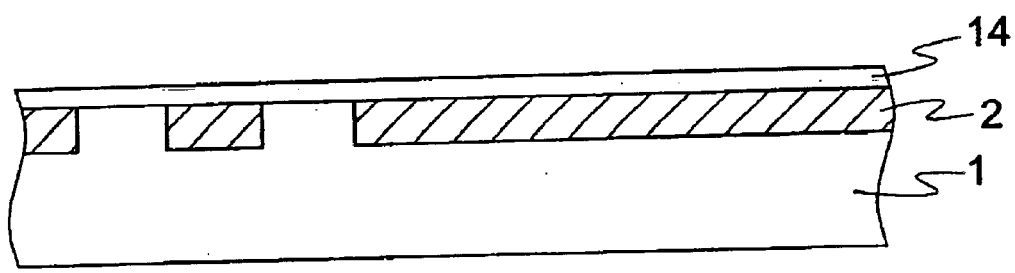

Further, polysilicon layer 14 in which N-type impurities are doped is formed (FIG. 21(b)).

Figure 21C:
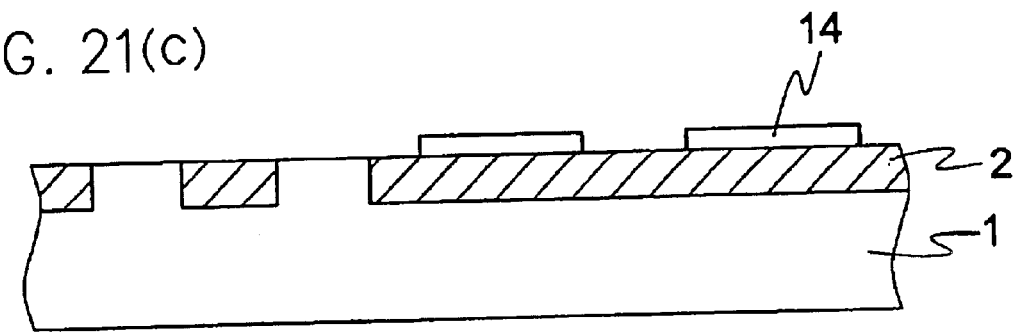

This polysilicon layer 14 is patterned (FIG. 21(c)) to leave regions to be a lower electrode of the capacitor and a lateral polysilicon diodes.

Figure 22A:
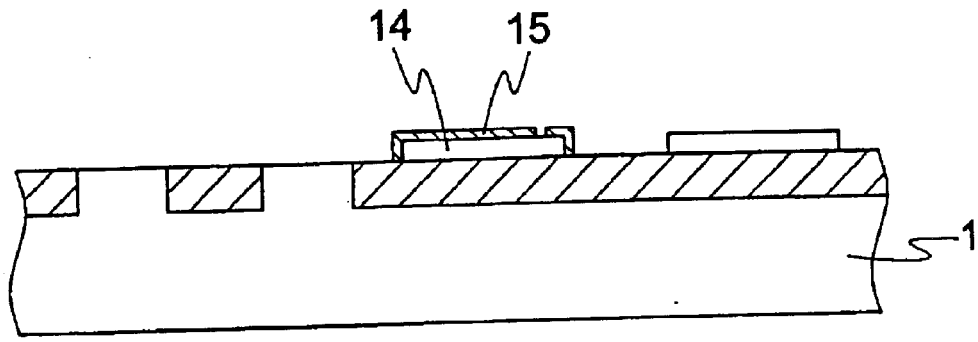
FIGS. 22(a)–22(c) show the manufacturing process following FIG. 21(c)

Hereinafter, an dielectric film 15 for capacitor is laminated and patterned (FIG. 22(a)).

Figure 22B:
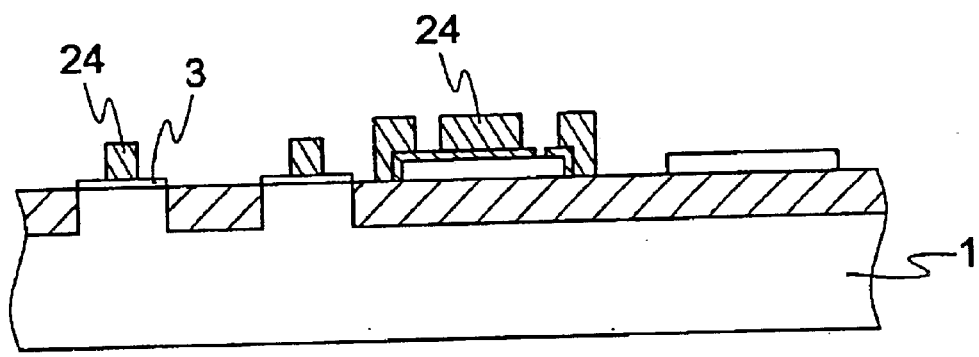

The gate insulating film 3 is formed, and further a non-doped polysilicon layer 24 is formed. Impurity ions are injected through a resist pattern into the polysilicon layer 24 to be a gate electrode of the NMOS transistor. Then the polysilicon layer 24 is patterned using the resist pattern so as to leave regions to be a gate electrode of NMOS transistor, a gate electrode of PMOS transistor and an upper electrode of capacitor (FIG. 22(b)).

Figure 22C:
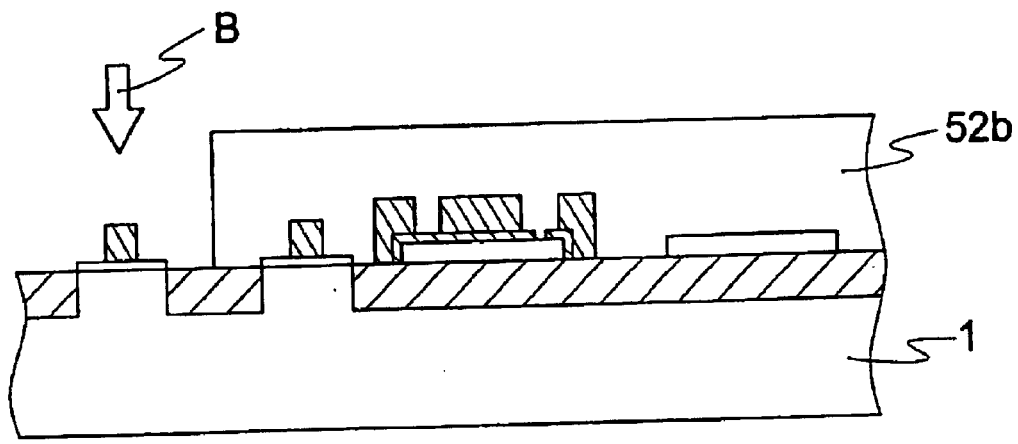

A resist pattern 52b is formed, and as shown by arrow B, ion implantation is carried out for forming LDD structure at source and drain of NMOS transistor (FIG. 22(c)).

Figure 23A:
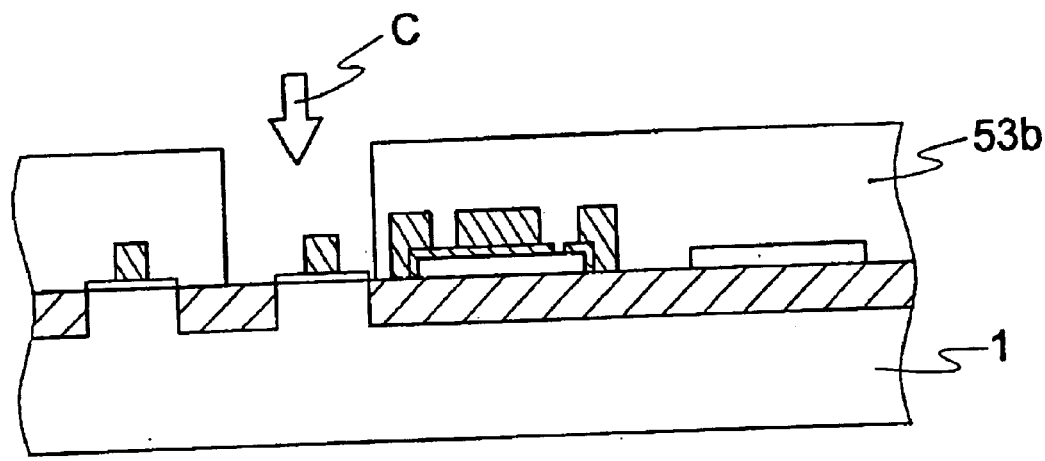
FIGS. 23(a) and 23(b) show the manufacturing process following FIG. 22(c)

The resist pattern 52b is removed and another resist pattern 53b is formed, and ion implantation is carried out for forming LDD structure at source and drain of PMOS transistor as shown by arrow C in the figure (FIG. 23(a)).

Figure 23B:
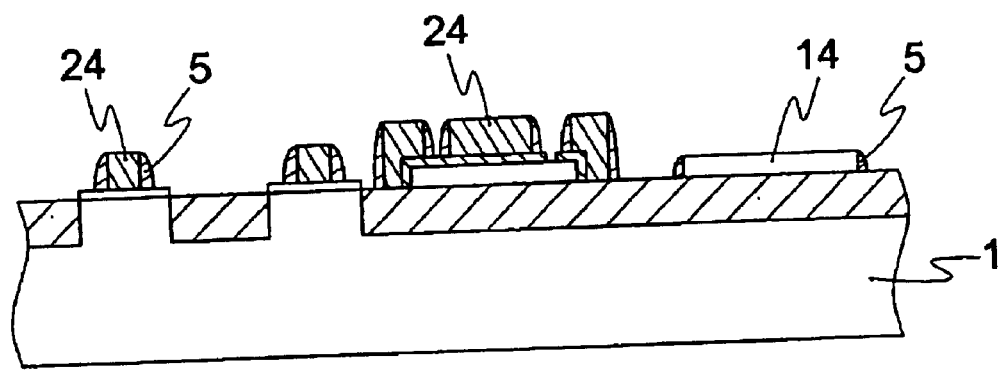

The resist pattern 53b is removed and dielectric film sidewall 5 are formed on the lateral side of the polysilicon layer 14 and 24 (FIG. 23(b)).

Figure 24A:
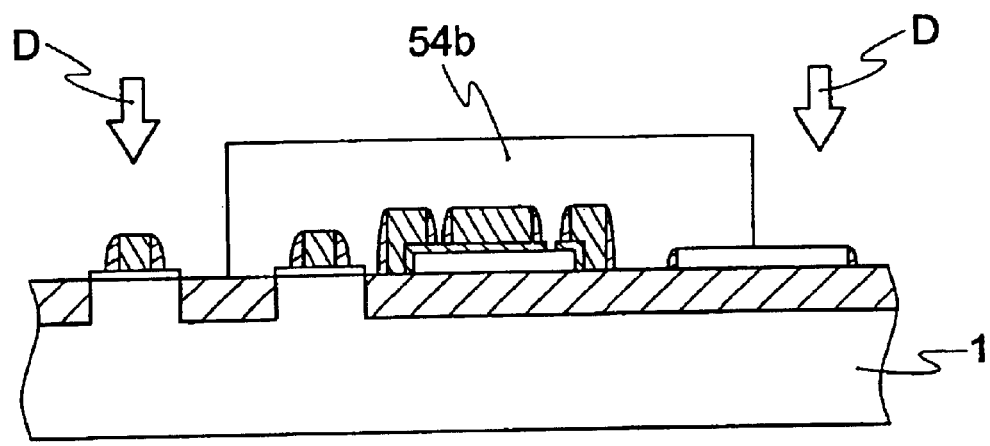
FIGS. 24(a) and 24(b) show the manufacturing process following FIG. 23(b)

Further, a resist pattern 54b is formed. And, simultaneously with ion implantation into source and drain of NMOS transistor, ions are injected into a N-type region of the lateral polysilicon diodes as shown by arrow D (FIG. 24(a)).

Figure 24B:
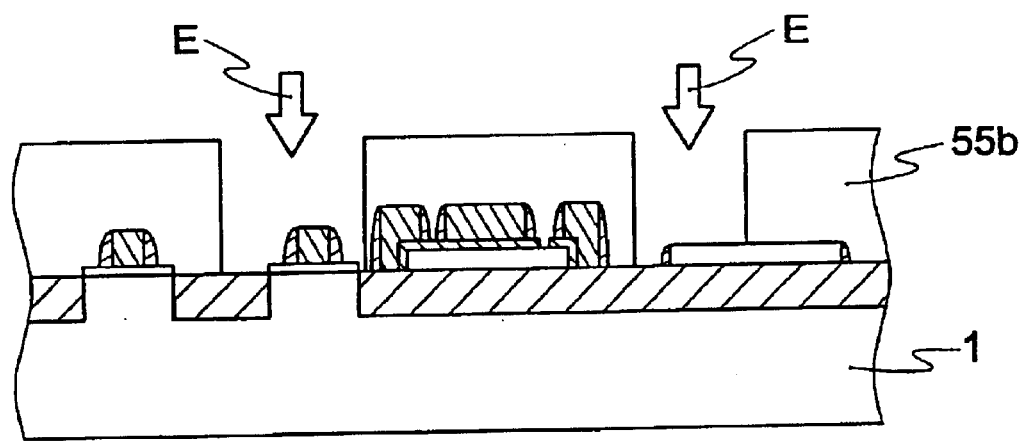

Further, the resist pattern 54b is removed and another new resist pattern 55b is formed. And, simultaneously with ion implantation into source and drain of PMOS transistor, ions are injected into a P-type region of the lateral polysilicon diodes as shown by arrow E (FIG. 24(b)).

Hereinafter, silicide wiring, interlayer dielectric film, a metal wiring and passivation film are formed in the same manner as the embodiment 4.

In the above-mentioned description, ion implantation for source and drain of PMOS transistor and ion implantation for the gate electrode of PMOS transistor are performed simultaneously. However, the impurity ion implantation can be carried out for the gate electrodes of PMOS transistor immediately after or before injecting impurity ion into the gate electrodes of NMOS transistor (FIG. 22(b)).

EMBODIMENT 7

Another manufacturing process of the high-frequency semiconductor device of embodiments 1, 2, and 3 is described referring to FIGS. 25(a)–28(b). FIGS. 25(a)–28(b) show the manufacturing process of the high-frequency semiconductor device wherein an NMOS transistor, a PMOS transistor, lateral polysilicon diodes, and a insulating film of the capacitor are formed on the region 91 for NMOS, region 92 for PMOS, region 93 for diodes, and region 94 for a capacitor, respectively.

Figure 25A:
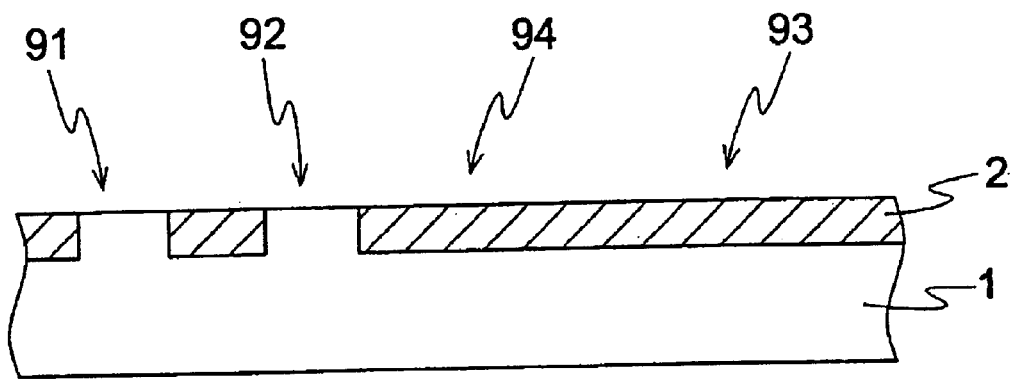
FIGS. 25(a)–25(c) show still other manufacturing processes of the high-frequency semiconductor device according to the present invention.

First of all, the oxide film 2 for separation and insulation is formed on the Si substrate 1, and wells are formed at the region 91 and 92 by ion implantation (FIG. 25(a)).

Figure 25B:
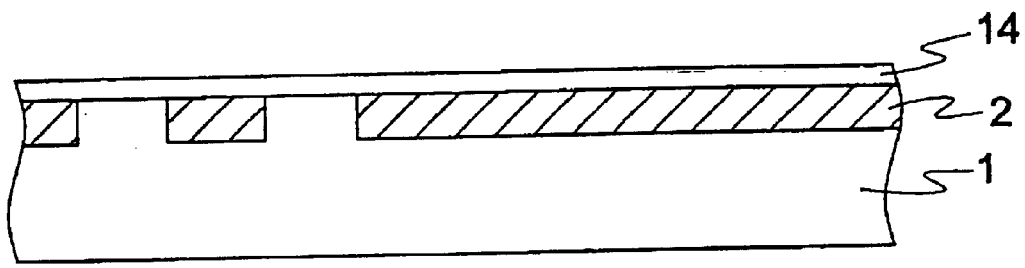

Further, polysilicon layer 14 in which N-type impurities are doped is formed (FIG. 25(b)).

Figure 25C:
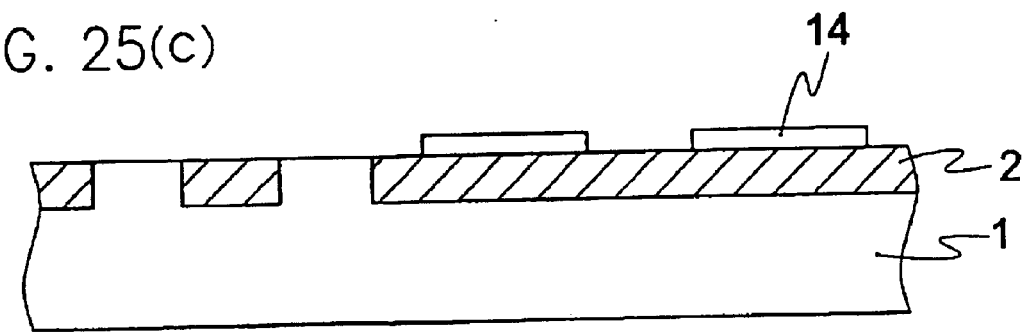

Next, this polysilicon layer 14 is patterned to leave regions to be a lower electrode of dielectric film of the capacitor and a lateral polysilicon diodes (FIG. 25(c)).

Figure 26A:
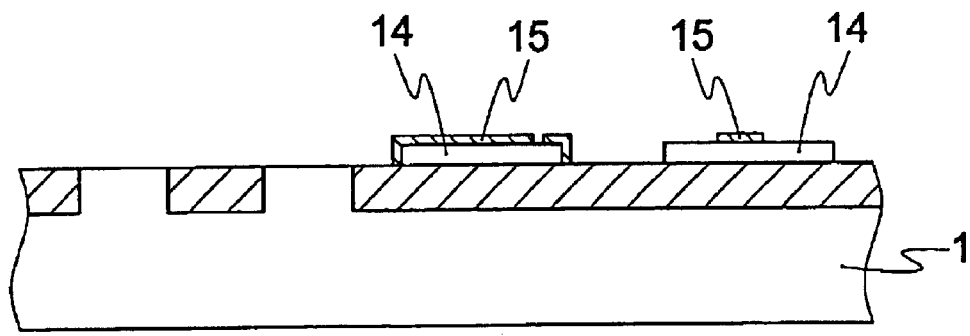
FIGS. 26(a)–26(c) show the manufacturing process following FIG. 25(c)

Hereinafter, an dielectric film 15 for capacitor is laminated and patterned (FIG. 26(a)). At this time, the dielectric film 15 is left on the polysilicon layer 14 also at the place where the PN junction of the lateral polysilicon diode would be formed.

The gate insulating film 3 is formed, and further a non-doped polysilicon layer 24 is formed. Impurity ions are injected through a resist pattern into regions to be a gate electrode of the NMOS transistor. Then the polysilicon layer 24 is patterned using the resist pattern so as to leave regions to be a gate electrode of NMOS transistor, a gate electrode of PMOS and an upper electrode of the capacitor (FIG. 26(b)). At this time, the polysilicon layer 24 is left on the polysilicon layer 14 also at the place where the PN junction of the lateral polysilicon diode would be formed.

Figure 26B:
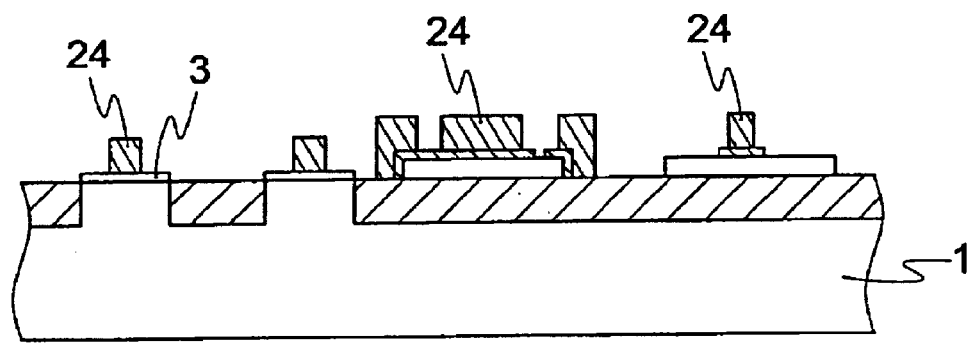
Figure 26C:
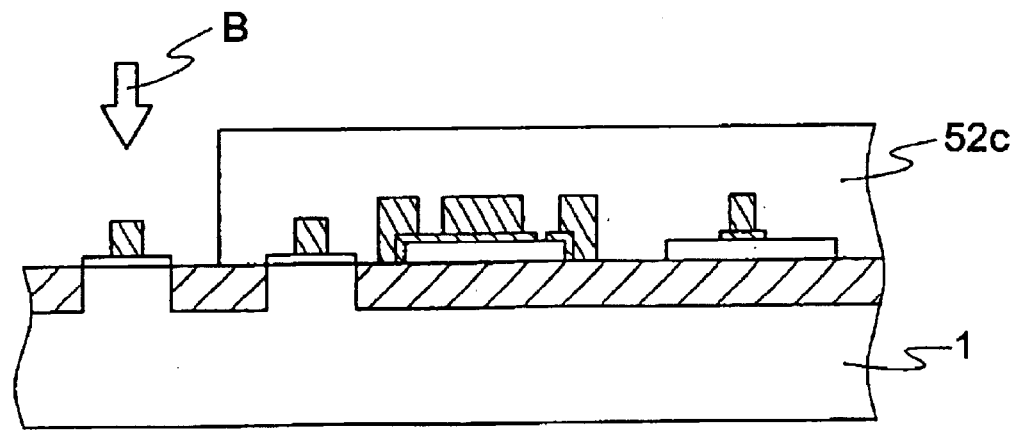

A resist pattern 52c is formed, and ion implantation is carried out for forming LDD structure at source and drain of NMOS transistor as shown by arrow B (FIG. 26(c)).

Figure 27A:
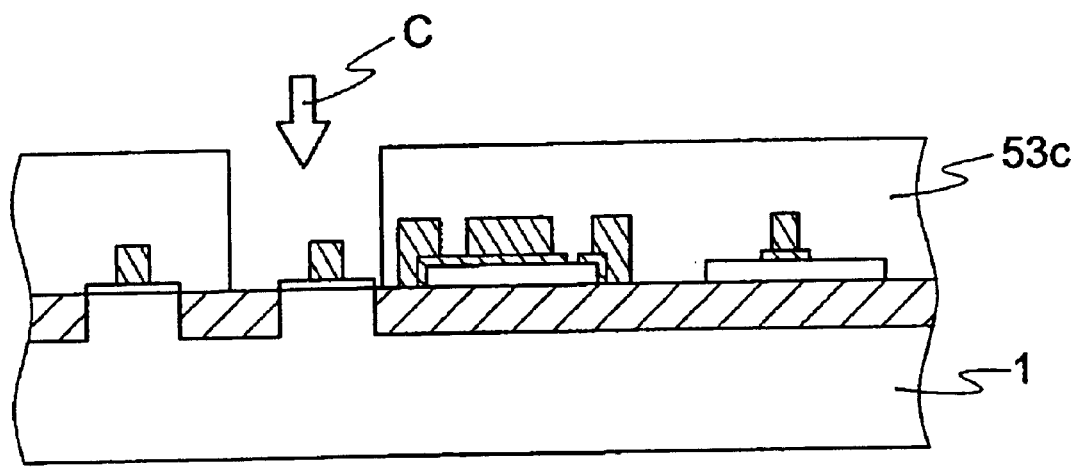
FIGS. 27(a) and 27(b) show the manufacturing process following FIG. 26(c)

The resist pattern 52c is removed and another resist pattern 53c is formed, and ion implantation is carried out for forming LDD structure at source and drain of PMOS transistor as shown by arrow C (FIG. 27(a)).

Figure 27B:
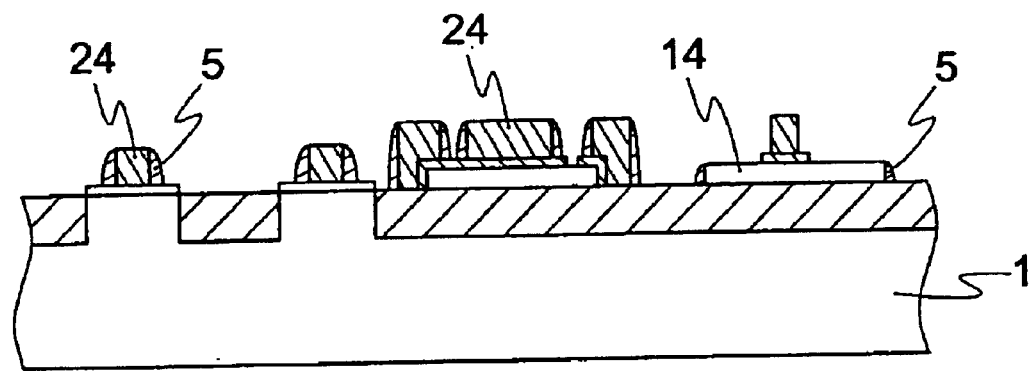

The resist pattern 53c is removed, and dielectric film sidewall 5 are formed on the lateral sides of the polysilicon layers 14 and 24 (FIG. 27(b)).

Figure 28A:
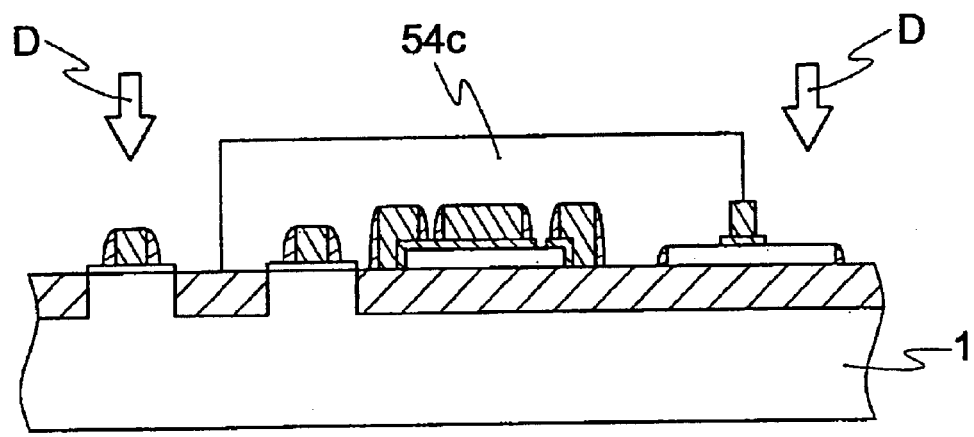
FIGS. 28(a) and 28(b) show the manufacturing process following FIG. 27(b)

After that, the resist pattern 54c is formed, and simultaneously with ion implantation into source and drain of NMOS transistor, ions are injected into a N-type region of the lateral polysilicon diodes as shown by arrow D (FIG. 28(a)).

Figure 28B:
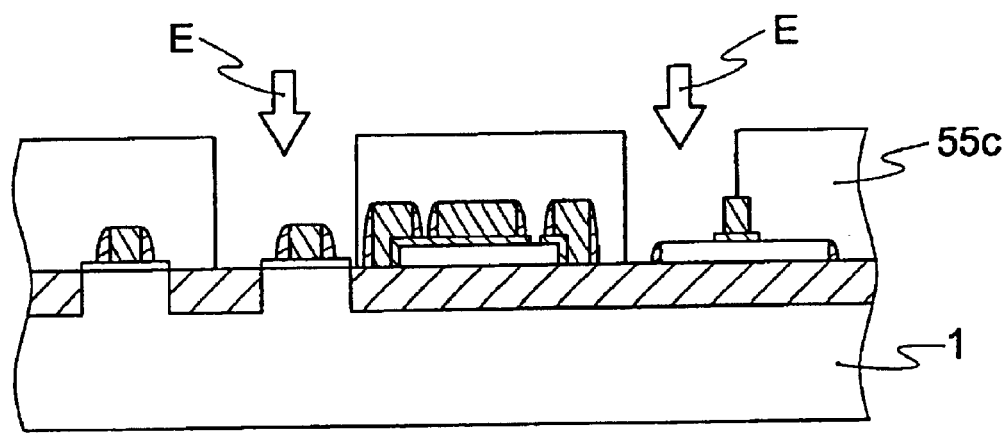

Further, the resist pattern 54c is removed and another new resist pattern 55b is formed, and simultaneously with ion implantation into source and drain of PMOS transistor, ions are injected into a P-type region of the lateral polysilicon diodes as shown by arrow E (FIG. 28(b)).

Hereinafter, silicide wiring, interlayer insulating film, a metal wiring and a passivation film can be formed in the same manner as the embodiment 4.

In the above-mentioned description, ion implantation for source and drain of PMOS transistor and ion implantation for the gate electrode of the PMOS transistor are performed simultaneously. However, the impurity ion implantation for the gate electrodes of PMOS transistor can be carried out immediately after or before injecting impurity ion into the gate electrodes of NMOS transistor (FIG. 26(b)).

EMBODIMENT 8

The method of forming lateral polysilicon diodes of embodiments 4, 5, 6, and 7 will be further described in detail referring to FIGS. 29(a)–32(b).

Figure 29A:
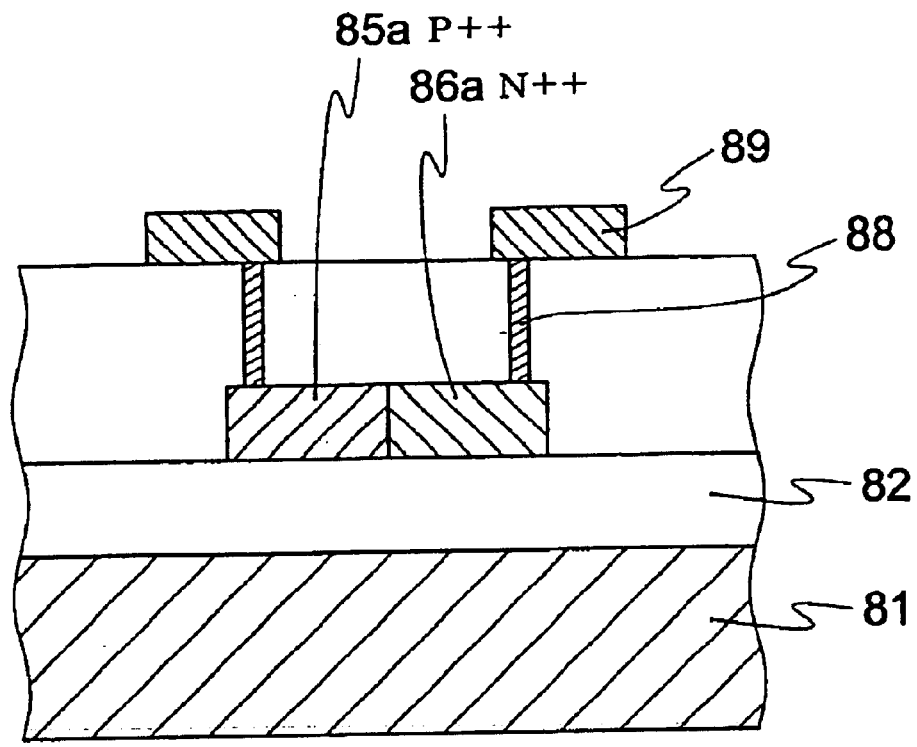
FIGS. 29(a) and 29(b) show an example of a PN junction of a lateral polysilicon diode.
Figure 29B:
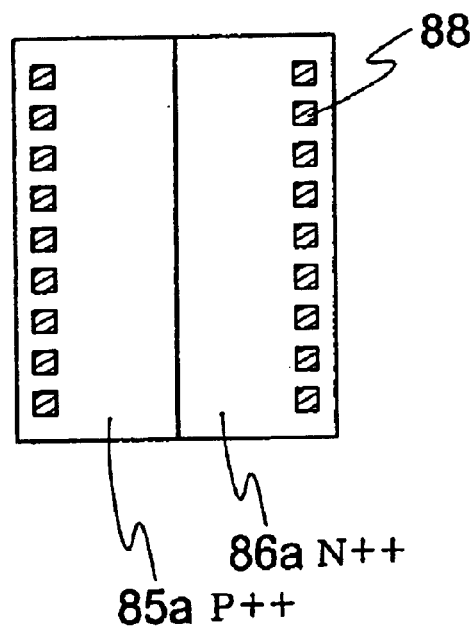

FIG. 29(a) is a sectional view of the lateral polysilicon diodes, and FIG. 29(b) is a top view of it. Onto an insulating layer 82 of silicon oxide formed on Si substrate 81, a lateral polysilicon diode composed of P++ region 85a heavily doped with P-type impurities and N++ region 86a heavily doped with N-type impurities is formed. The lateral polysilicon diode is connected with metal wirings 89 via contacts 88.

Such a lateral polysilicon diodes are formed by injecting N-type impurity ions heavily into the region 86a masking the region 85a with a resist pattern (e.g., the resist pattern 54 in the embodiment 4), and further injecting P-type impurity ions heavily into the region 85a masking the region 86a with a resist pattern (e.g., the resist pattern 55 in the embodiment 4). Of course, the procedure of ion implantations of N-type and P-type may be changed.

Figure 30A:
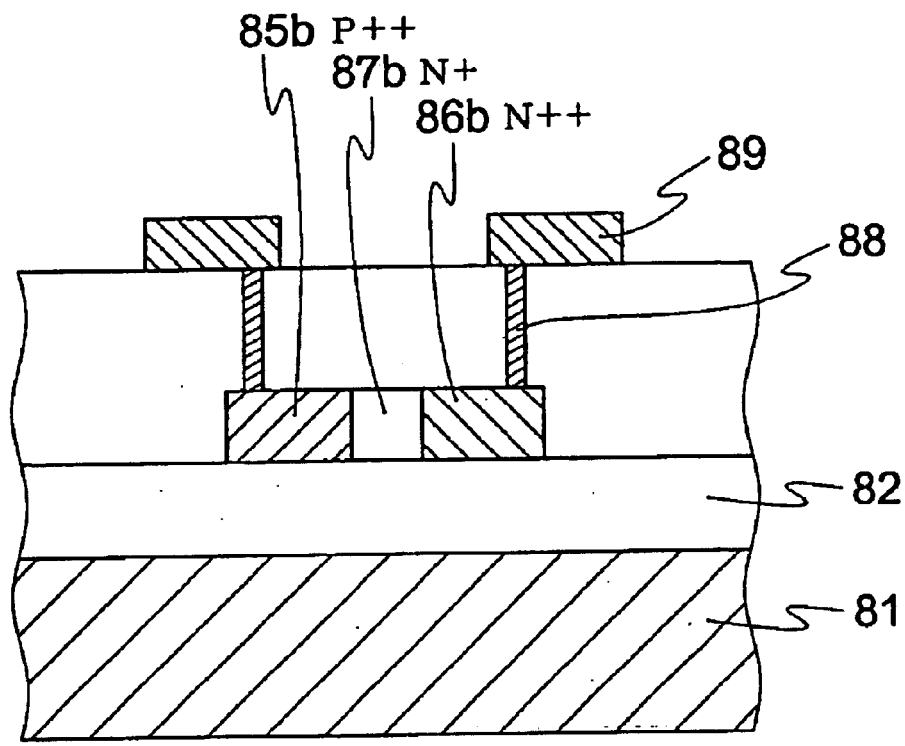
FIGS. 30(a) and 30(b) show another example of a PN junction of a lateral polysilicon diode.
Figure 30B:
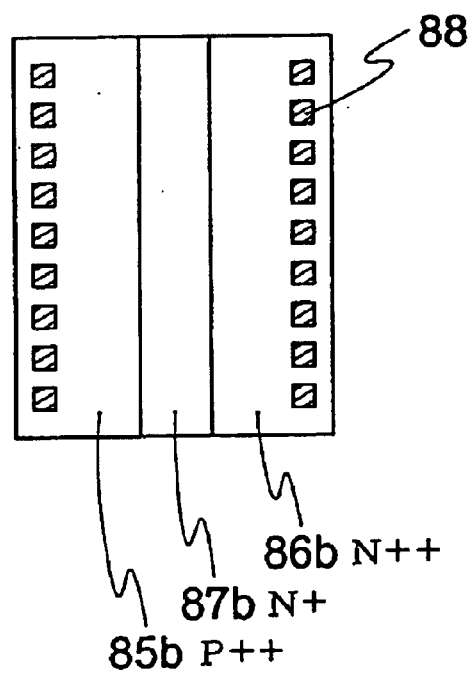

FIG. 30(a) is a sectional view of the lateral polysilicon diodes, and FIG. 30(b) is a top view of it. Onto an insulating layer 82 of silicon oxide formed on Si substrate 81, a lateral polysilicon diode composed of P++ region 85b heavily doped with P-type impurities, N+ region 87b doped with N-type impurities and N++ region 86b heavily doped with N-type impurities is formed. The lateral polysilicon diode is connected with metal wirings 89 via contacts 88.

The lateral polysilicon diode of FIG. 30 can be made as follows. Firstly, entire region of 85b, 87b and 86b are formed from polysilicon doped with N-type impurities. Next, N-type impurity ions are heavily injected into the region 86b masking the region 85b and 87b with a resist pattern, and further P-type impurity ions are heavily injected into the region 85b masking the region 87b and 86b with a resist pattern. Of course, the procedure of ion implantations of N-type and P-type may be changed.

Moreover, according to the embodiment 7, it is possible to define precise boundaries between of the region 87b and the region 86b, and between the region 87b and the region 85b respectively, with using the polysilicon layer 24 and/or the dielectric film 15 formed on the polysilicon layer 14 at the place where the PN junction of the lateral polysilicon diode would be formed (FIG. 26(b)), without using resist pattern. It is possible to keep the width of the region 87b constantly without varying the width due to declination of resist pattern, and reduce variation of diode characteristics. Therefore, it is possible to realize a high-frequency semiconductor device having high reliability.

Figure 31A:
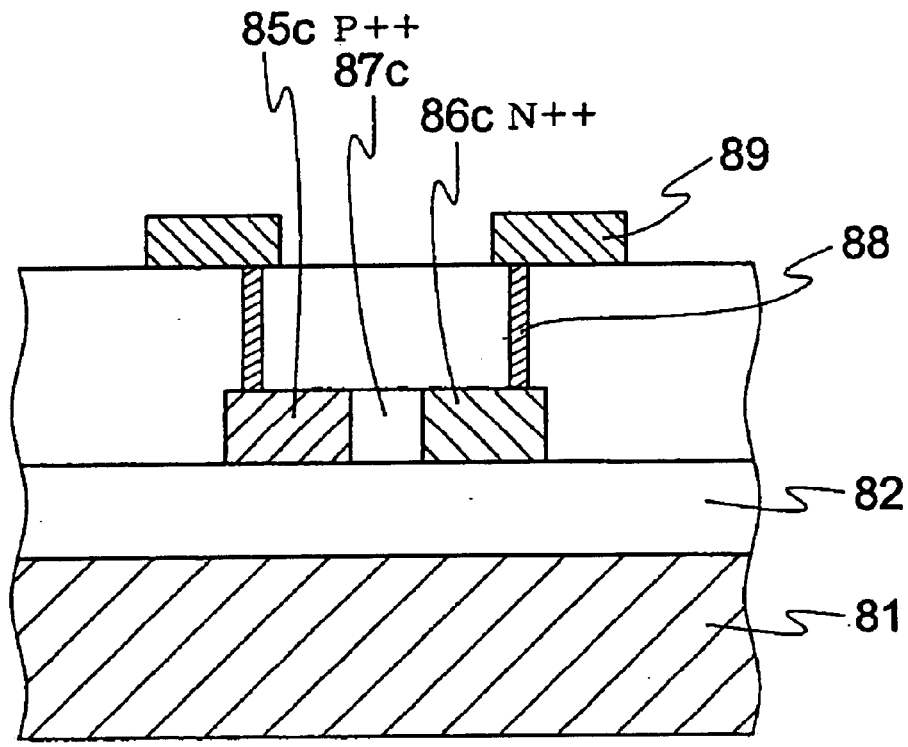
FIGS. 31(a) and 31(b) show still another example of a PN junction of a lateral polysilicon diode.
Figure 31B:
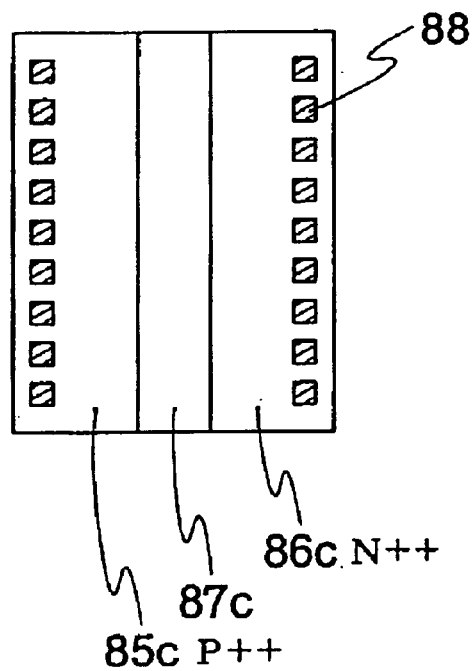

FIG. 31(a) is a sectional view of the lateral polysilicon diodes, and FIG. 31(b) is a top view of it. Onto the insulating layer 82 of silicon oxide formed on the Si substrate 81, a lateral polysilicon diode composed of P++ region 85c heavily doped with P-type impurities, a region 87c substantially non-doped and N++ region 86c heavily doped with N-type impurities is formed. The lateral polysilicon diode is connected with metal wirings 89 via contacts 88.

The lateral polysilicon diode of FIG. 31 can be made as follows. Firstly, entire region of 85c, 87c and 86c are formed from non-doped polysilicon. Next, N-type impurity ions heavily injected into the region 86c masking the region 85c and 87c with a resist pattern, and further P-type impurity ions are heavily injected into the region 85c masking the region 87c and 86c with a resist pattern. Of course, the procedure of ion implantations of N-type and P-type may be changed.

Moreover, according to the embodiment 7, it is possible to define precise boundaries between of the region 87c and the region 86c, and between the region 87c and the region 85c respectively, with using the polysilicon layer 24 and/or the dielectric film 15 on the polysilicon layer 14 to be the lateral polysilicon diodes, without using resist pattern. It is possible to keep the width of the region 87c constantly without varying the width due to declination of resist pattern, and reduce variation of diode characteristics. Therefore, it is possible to realize a high-frequency semiconductor device having high reliability.

Figure 32A:
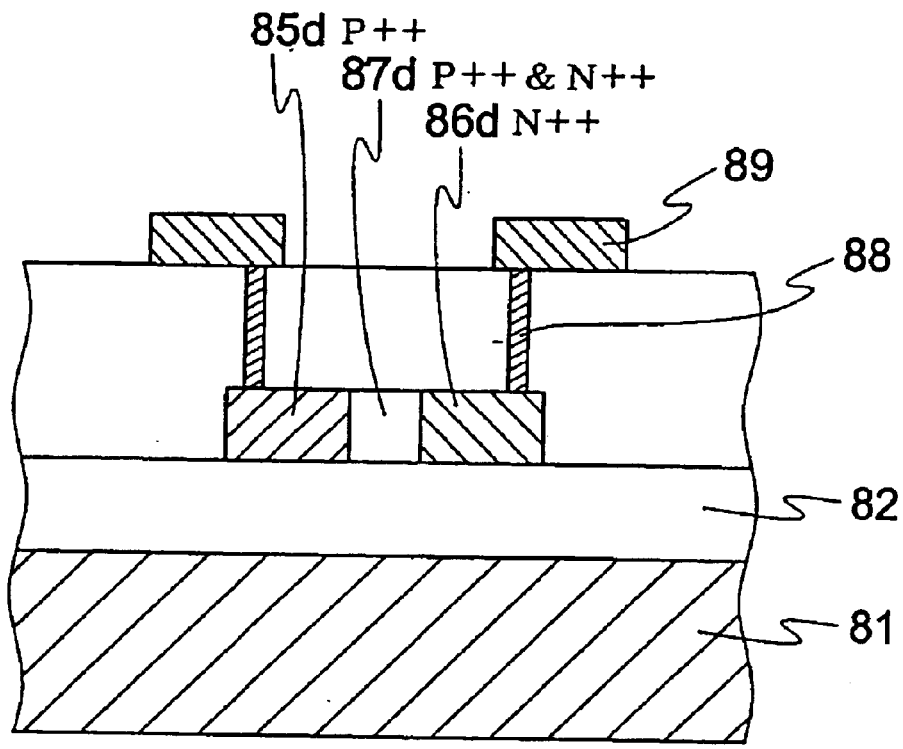
FIGS. 32(a) and 32(b)show still another example of a PN junction of a lateral polysilicon diode.
Figure 32B:
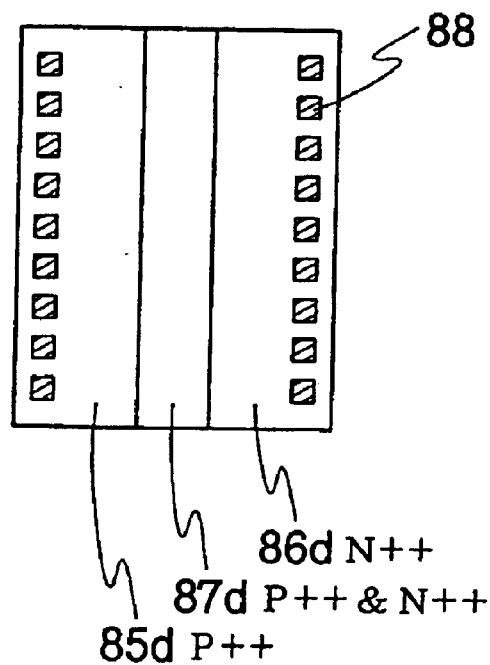

FIG. 32(a) is a sectional view of the lateral polysilicon diodes, and FIG. 32(b) is a top view of it. Onto the insulating layer 82 of silicon oxide formed on the Si substrate 81, a lateral polysilicon diode composed of P++ region 85d heavily doped with P-type impurities, a region 87d heavily doped with P-type and N-type impurities and N++ region 86d heavily doped with N-type impurities is formed. The lateral polysilicon diode is connected with the metal wirings 89 via the contacts 88.

The lateral polysilicon diode is formed by injecting N-type impurity ions heavily into the region 87d and 86d masking the region 85d with a resist pattern, further by injecting P-type impurity ions heavily into the region 85d and 87d masking the region 86d with a resist pattern. An impurity concentration of the region 87d is determined by the differences of the concentration between injected N-type impurity ion and P-type impurity ion. Of course, the procedure of ion implantations of N-type and P-type may be changed.

EMBODIMENT 9

As explained so far, in the present invention, the lateral polysilicon diodes 38 and 37 are formed and connected between the high-frequency I/O signal line and the external power supply VDD and/or between the high-frequency I/O signal line and the ground GND so as to prevent destruction of the internal circuit 100 due to ESD with dispersing positive high voltage ESD surge to the external power supply VDD, and negative high voltage ESD surge to the ground GND respectively.

Figure 33:
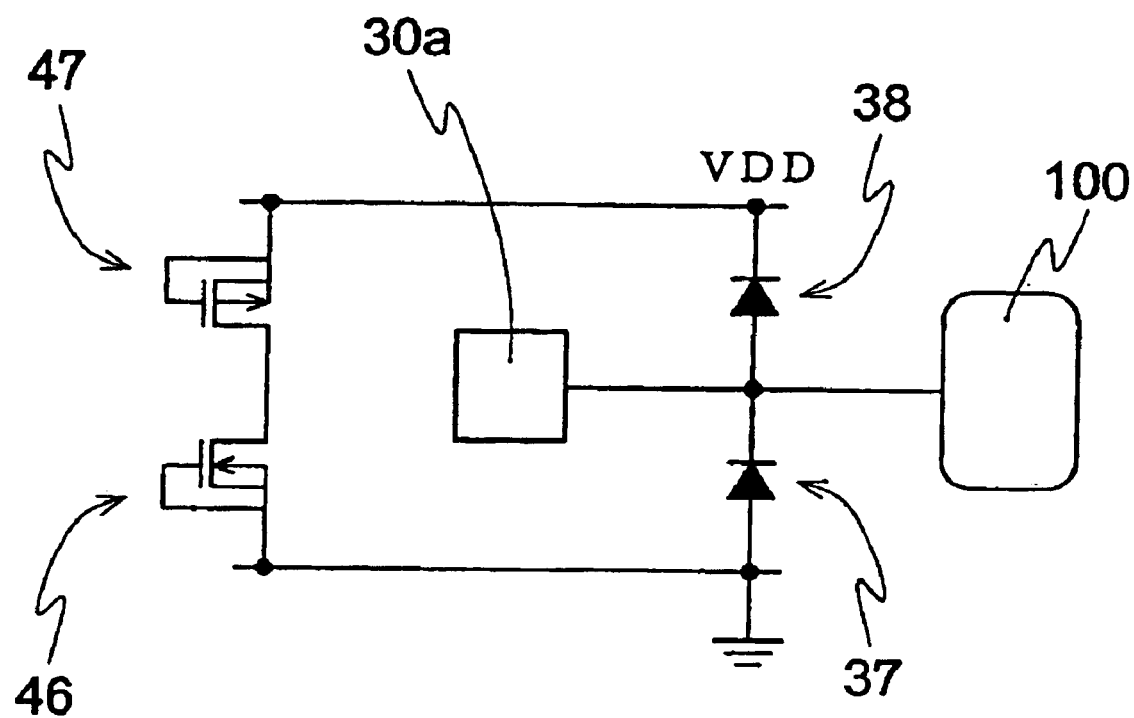

Further, as shown in FIG. 33, it is assumed that the case where a protection circuit employing with MOS transistors is attached between the external power supply VDD and the ground GND in the high-frequency semiconductor device having ESD protection circuit employing lateral polysilicon diodes.

In FIG. 33, gate, source and P-well of NMOS transistor 46 are grounded to GND, and its drain is connected to the drain of PMOS transistor 47. On the other hand, gate, source and N-well of PMOS 47 are connected to the external power supply VDD.

A positive high voltage ESD surge impressed to the high-frequency signal I/O pad 30a is dispersed to the VDD through the lateral polysilicon diode 38. The positive voltage surge entered into the VDD is impressed to the source of PMOS 47 being in OFF state, and PN junction of the source diffusion layer thereof causes breakdown, therefore "parasitic bipolar transistor action" is occurred and the current flows into the GND.

At this time, the potential of VDD and the high-frequency I/O signal line rises to the breakdown voltage of PN junction of the source diffusion layer in PMOS 47. Therefore, a reverse high voltage, which equals to the breakdown voltage of PN junction of silicon, is impressed to the lateral polysilicon diodes 37 attached between the high-frequency I/O signal line and GND. Similarly, in a case where a negative high voltage ESD surge is entered into the high-frequency signal I/O pad 30a, the reverse voltage is impressed to the lateral polysilicon diodes 38.

The lateral polysilicon diode is made from polysilicon which includes a lot of defects and traps of deep energy, thereby characteristics thereof is easily deteriorated in case of breakdown due to reverse high voltage. Therefore, it is impossible to protect the circuit against the next ESD surge.

Figure 34A:
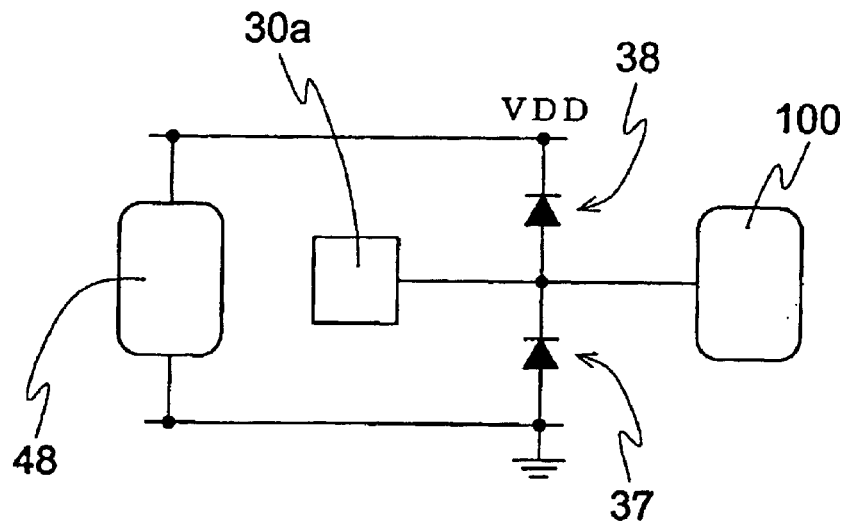
FIGS. 34(a)–34(c) show a clamp circuit connected between VDD and GND according to the present invention.

Therefore, in the present embodiment, as shown in FIG. 34(a), a clamp circuit 48, which starts operating at a lower voltage than the reverse breakdown voltage of the lateral polysilicon diode, is connected between the external power supply VDD and the ground GND.

Figure 34B:
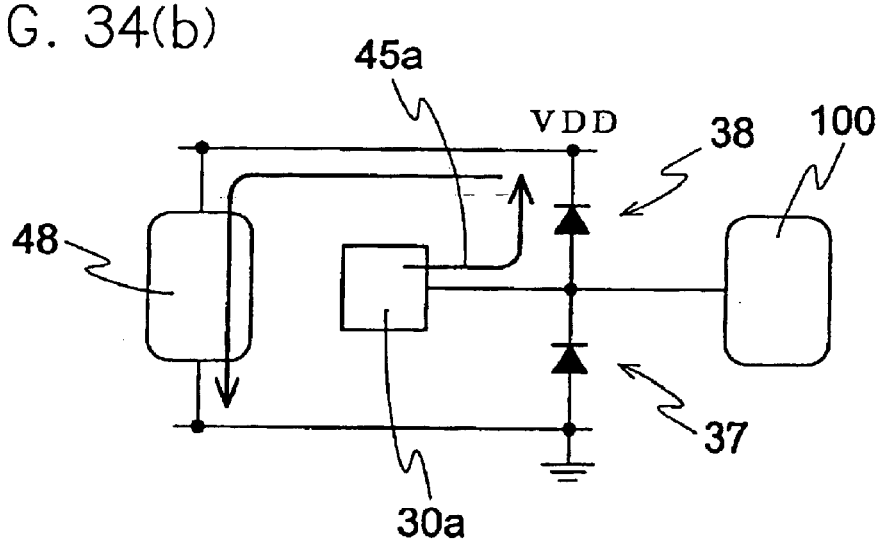

The positive high voltage ESD surge 45a entered into the VDD shall be dispersed to the GND through the clamp circuit 48 which is turned ON by a slight increase of the potential of the VDD (FIG. 34(b)). Since a turn ON voltage of the clamp circuit 48 is smaller than reverse breakdown voltage of the lateral polysilicon diodes 37, a voltage of VDD shall not become higher. Therefore, a voltage of the high-frequency I/O signal line is kept below the absolute value of the reverse breakdown voltage of the lateral polysilicon diode 37, thereby preventing reverse breakdown of the diode 37 and deterioration of the diode 37 due to the reverse breakdown.

Figure 34C:
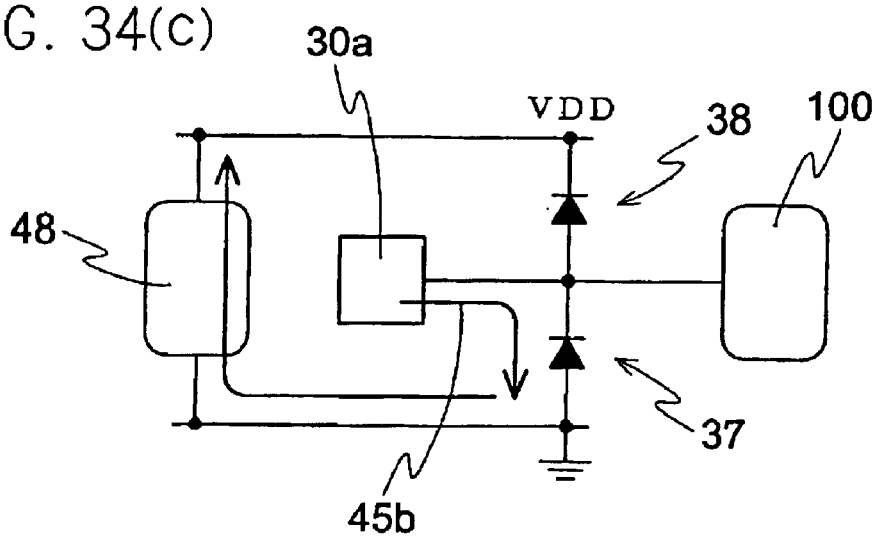

In case of dispersing negative high voltage surge 45b entered into the high-frequency signal I/O pad 30a to the GND through the lateral polysilicon diodes 37, it is also possible to prevent deterioration of the lateral polysilicon diode 38 with preventing reverse breakdown of the diode 38 similarly (FIG. 34(c)).

As described above, according to the present embodiment, it is possible to protect the internal circuit against multiple impressions of ESD surge with preventing deterioration of the lateral polysilicon diode with preventing reverse breakdown thereof.

The embodiment of the clamp circuit 48 will be described with referring to FIG. 35 and 36.

Figure 35:
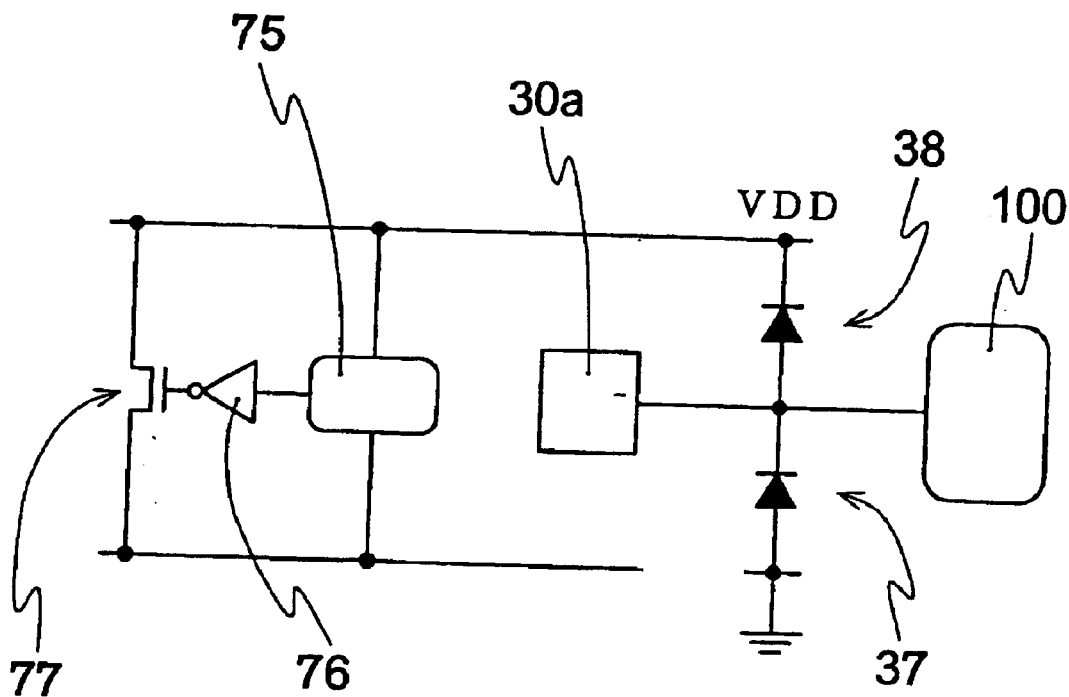
FIG. 35 is a figure showing an example of a clamp circuit connected between VDD and GND.

In FIG. 35, the clamp circuit 48 comprises ESD detection circuit 75, inverter 76 and NMOS transistor 77. An output of the ESD detection circuit 75 is connected to the inverter 76, and the output of the inverter 76 is connected to the gate of NMOS 77. NMOS 77 has wide gate so as to allow a large current.

The detection circuit 75 immediately detects sudden increase of VDD voltage due to the impression of ESD surge, and NMOS 77 is turned ON via the inverter 76. Therefore it is possible to disperse a large current from VDD to GND through the NMOS 77.

Accordingly, the voltage of VDD as well as high-frequency I/O signal line shall not increase, thereby preventing that a high voltage larger than reverse breakdown voltage shall be impressed to the lateral polysilicon diodes 37 which is attached between the high-frequency I/O signal line and GND.

Figure 36:
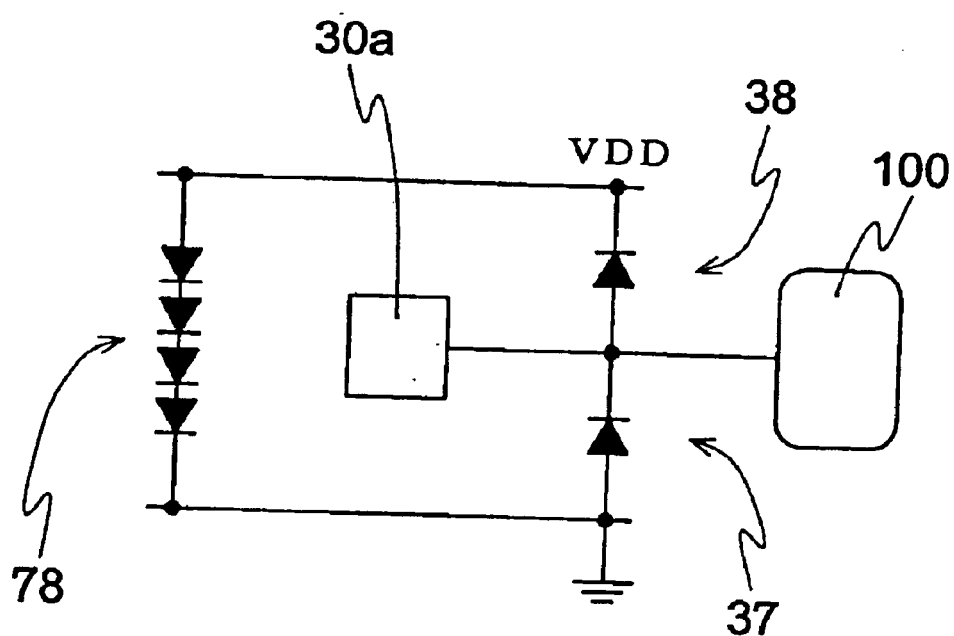
FIG. 36 shows another example of a clamp circuit connected between VDD and GND.

In FIG. 36, the clamp circuit 48 comprises "x" pieces of diode 78 attached in series, and forward direction of the diodes is the direction from the VDD to the GND, thereby enables to flow the large current from VDD to GND when the potential difference between VDD and GND becomes "x" times of the turn ON voltage of the diode 78.

By choosing "x" so that "x" times of the turn ON voltage of the diode 78 should be smaller than the reverse breakdown voltage of the lateral polysilicon diode, the voltage of VDD and the high-frequency I/O signal line can be kept lower than the reverse breakdown voltage of the lateral polysilicon diodes, so that the characteristic of the lateral polysilicon diodes shall not be deteriorated.

In addition to the lateral polysilicon diodes, made of typical PN junction diodes can also be used as the diode 78 and.

According to the present invention, a clamp circuit employing lateral polysilicon diodes as ESD protection element is attached to the high-frequency I/O signal line among all I/O lines of high-frequency device employing Si-MOS transistor so as to decrease the parasitic capacitances between the diode and Si substrate, thereby preventing high-frequency signal leaking into the Si substrate via the parasitic capacitances. Therefore it is possible to achieve sophisticated and highly reliable high frequency semiconductor device.

A DC bias voltage of high-frequency I/O signal line can be set between VDD and GND, thereby keeping the voltage of the signal line lower than that of VDD to prevent the diode being turned ON even if VDD varies. Therefore a sophisticated and highly reliable high frequency semiconductor device with high ESD resistance can be achieved.

Further, the clamp circuit employing lateral polysilicon diodes as ESD protection element is attached to the high-frequency I/O signal line among all I/O lines of high-frequency semiconductor device employing Si-MOS transistor. The high-frequency I/O signal line shall not cause mis-operation even if a large reverse bias leakage current flows through the lateral polysilicon diodes, since the signal line only supplies bias voltage at DC circuit operation. Therefore, the problem in caused by the large reverse bias leakage current of the lateral polysilicon diodes is solved, and a sophisticated and highly reliable high frequency semiconductor device with high ESD resistance is achieved employing the lateral polysilicon diodes as ESD protection element in the clamp circuit.

Moreover, the lateral polysilicon diodes of the clamp circuit operate only when ESD surge is impressed. Therefore, it is possible to use lateral polysilicon diodes, which had not been ensured reliability for ON/OFF switching operation to be expected in ten years in logic devices as the ESD protection elements.

Plurality of diodes are connected in series to configure the clamp circuit, thereby keeping a reverse bias voltage to be impressed to each diodes less than band gap voltage of Si (approx. 1.1 [V]). Therefore tunnel effect between bands is prevented, and thereby reducing DC current consumption with reducing reverse leakage current of the lateral polysilicon diodes.

A high-frequency semiconductor device employing with lateral polysilicon diodes as ESD protection element wherein lateral polysilicon diodes are formed from polysilicon layer for forming lower electrodes of the capacitor, and gate electrodes of MOS transistor are formed from another polysilicon layer. Therefore, it becomes possible to optimize forming condition such as thickness and impurities concentration and the like of polysilicon layers suitable for the MOS transistor and the lateral polysilicon diodes respectively and high reliability thereof can be realized simultaneously.

By leaving the dielectric film to form the capacitor and/or polysilicon layer to form the upper electrode of the capacitor on PN junction of the lateral polysilicon diodes, it becomes possible to reduce variation of diode characteristics due to declination of resist pattern, and realize a high-frequency semiconductor device having high reliability.

In addition, the "i" region can be formed at the PN junction of the lateral polysilicon diode by leaving the dielectric film to form the capacitor and/or polysilicon layer to form the upper electrode of the capacitor on PN junction of the lateral polysilicon diodes and blocking ion implantation with the film and/or the layer. Moreover, it becomes possible to keep the width of the "i" region of the PIN junction constantly without varying the width due to declination of resist pattern so that the diodes having good and uniform qualities are obtained.

Further, the clamp circuit, which starts operating at lower voltage than reverse breakdown voltage of the lateral polysilicon diodes, is attached between the external power supply VDD and the ground GND. Therefore reverse voltage breakdown of the lateral polysilicon diodes are prevented to avoid deterioration of their characteristics so that it becomes possible to protect the interval circuit against multiple impression of ESD surge.

While there has been described what is at present considered to be preferred embodiment of the invention, it will be understood that various modifications may be made therein, and it is intended to cover in the appended claims all such modifications as fall within the true spirit and scope of the invention.

What is claimed is:

1. A high-frequency semiconductor device comprising:
   a substrate;
   an Si MOS transistor on the substrate; and
   m lateral polysilicon diodes on the substrate, each of the m lateral polysilicon diodes having a forward direction and a reverse direction, wherein the m lateral polysilicon diodes are connected in series in the forward direction between a high-frequency I/O signal line and an externally supplied voltage, VDD, a reverse bias voltage impressed on each of the m lateral polysilicon diodes is smaller than 1.1 volts, and m is an integer greater than 1.

2. A high-frequency semiconductor device comprising:

a substrate;

an Si MOS on the substrate; and n lateral polysilicon diodes on the substrate, each of the n lateral polysilicon diodes having a forward direction and a reverse direction, wherein the n lateral polysilicon diodes are connected in series in the forward direction, between ground, GND, and a high-frequency I/O signal line, a reverse bias voltage impressed on each of the n lateral polysilicon diodes is smaller than 1.1 volts, and n is an integer greater than 1.

3. A high-frequency semiconductor device comprising:

a substrate;

an Si MOS transistor on the substrate; and m lateral polysilicon diodes on the substrate, each of the lateral polysilicon diodes having a forward direction and a reverse direction, the m polysilicon diodes being connected in series in the forward direction between a high-frequency I/O signal line and an externally supplied voltage, VDD, and n lateral polysilicon diodes on the substrate, each of the n lateral polysilicon diodes having a forward direction and a reverse direction, the n polysilicon diodes being connected in series between the ground, GND, and the high-frequency I/O signal line, wherein m and n are positive integers;

VDD/(n+m) is smaller than 1.1 volts, and at least one of m and n is greater than 1.

4. The high-frequency semiconductor device of claim 3, wherein no lateral polysilicon diode is connected to any signal line other than the high frequency I/O signal line.

5. A high-frequency semiconductor device comprising:

a substrate;

an Si MOS transistor on the substrate;

a first lateral polysilicon diode on the substrate, the first lateral polysilicon diode having a forward direction and a reverse direction, wherein the first lateral polysilicon diode connects, in the forward direction, a high-frequency I/O signal line to an externally supplied voltage VDD; and a capacitor having lower and upper polysilicon electrodes, wherein the first lateral polysilicon diode and the lower electrode of the capacitor share a single first polysilicon layer, the MOS transistor has a polysilicon gate from a second polysilicon layer, the first and second polysilicon layers having at least one of (i) different dopant impurity concentrations and (ii) different thicknesses, and the polysilicon layer of the upper electrode of the capacitor covers a PN junction of the first lateral polysilicon diode.

6. A high-frequency semiconductor device comprising:

a substrate;

an Si MOS transistor on the substrate;

a first lateral polysilicon diode on the substrate, the first lateral polysilicon diode having a forward direction and a reverse direction, wherein the first lateral polysilicon diode connects, in the forward direction, a high-frequency I/O signal line to an externally supplied voltage VDD; and a capacitor having lower and upper polysilicon electrodes, wherein the first lateral polysilicon diode and the lower electrode of the capacitor share a single first polysilicon layer, the MOS transistor has a polysilicon gate from a second polysilicon layer, the first and second polysilicon layers having at least one of (i) different dopant impurity concentrations and (ii) different thicknesses, and the capacitor includes a dielectric layer and the dielectric layer covers a PN junction of the first lateral polysilicon diode.

7. A high-frequency semiconductor device comprising:

a substrate;

an Si MOS transistor on the substrate;

a first lateral polysilicon diode on the substrate, the first lateral polysilicon diode having a forward direction and a reverse direction, wherein the first lateral polysilicon diode connects, in the forward direction, ground, GND, to a high-frequency I/O signal line; and a capacitor having lower and upper polysilicon electrodes, wherein the first lateral polysilicon diode and the lower electrode of the capacitor share a single first polysilicon layer, the MOS transistor has a polysilicon gate from a second polysilicon layer, the first and second polysilicon layers having at least one of (i) different dopant impurity concentrations and (ii) different thicknesses, and the polysilicon layer of the upper electrode of the capacitor covers a PN junction of the first lateral polysilicon diode.

8. A high-frequency semiconductor device comprising:

a substrate;

an Si MOS transistor on the substrate;

a first lateral polysilicon diode on the substrate, the first lateral polysilicon diode having a forward direction and a reverse direction, wherein the first lateral polysilicon diode connects, in the forward direction, around, GND, to a high-frequency I/O signal line; and a capacitor having lower and upper polysilicon electrodes, wherein the first lateral polysilicon diode and the lower electrode of the capacitor share a single first polysilicon layer, the MOS transistor has a polysilicon gate from a second polysilicon layer, the first and second polysilicon layers having at least one of (i) different dopant impurity concentrations and (ii) different thicknesses, and the capacitor includes a dielectric layer and the dielectric layer covers a PN junction of the first lateral polysilicon diode.

* * * * *